(12) United States Patent
Uppili et al.

(10) Patent No.: US 12,469,705 B2
(45) Date of Patent: Nov. 11, 2025

(54) VERTICAL TRENCH DEVICE CONFIGURATIONS FOR RADIATION-ENVIRONMENT APPLICATIONS

(71) Applicant: SCDevice LLC, Portland, OR (US)

(72) Inventors: Sudarsan Uppili, Portland, OR (US); David Lee Snyder, Beaverton, OR (US); Scott Joseph Alberhasky, Hillsboro, OR (US)

(73) Assignee: SCDevice LLC, Portland, OR (US)

( * ) Notice: Subject to any disclaimer, the term of this patent is extended or adjusted under 35 U.S.C. 154(b) by 373 days.

(21) Appl. No.: 18/135,099

(22) Filed: Apr. 14, 2023

(65) Prior Publication Data

US 2023/0352304 A1    Nov. 2, 2023

Related U.S. Application Data

(60) Provisional application No. 63/336,575, filed on Apr. 29, 2022.

(51) Int. Cl.
| | |
|---|---|
| *H01L 21/265* | (2006.01) |
| *H01L 21/266* | (2006.01) |
| *H01L 21/285* | (2006.01) |
| *H10D 8/01* | (2025.01) |
| *H10D 8/60* | (2025.01) |

(Continued)

(52) U.S. Cl.
CPC ...... *H01L 21/26513* (2013.01); *H01L 21/266* (2013.01); *H01L 21/28537* (2013.01); *H10D 8/051* (2025.01); *H10D 8/60* (2025.01); *H10D 30/061* (2025.01); *H10D 30/871* (2025.01); *H10D 62/83* (2025.01); *H10D 62/8325* (2025.01)

(58) Field of Classification Search
CPC ............... H10D 30/061; H10D 30/871; H10D 30/0515; H10D 30/831; H01L 21/266
See application file for complete search history.

(56) References Cited

U.S. PATENT DOCUMENTS

| 7,479,672 B2 | 1/2009 | Zhao |
| 2015/0028350 A1 | 1/2015 | Suvorov et al. |

(Continued)

OTHER PUBLICATIONS

A. Hallén, et al., "Recent Advances in the Doping of 4H-SiC by Channeled Ion Implantation", Materials Science Forum, ISSN: 1662-9752, vol. 963, Jul. 19, 2019, Available at: doi:10.4028/www.scientific.net/MSF.963.375, pp. 375-381.

(Continued)

*Primary Examiner* — Wasiul Haider
(74) *Attorney, Agent, or Firm* — Daylight Law, P.C.

(57) ABSTRACT

Semiconductor devices and associated fabrication methods are disclosed. In one disclosed approach a process for forming a semiconductor device is provided. The process includes: implanting a first region of semiconductor material using a first channeled implant with a first conductivity type; and implanting, after the first channeled implant, a second region of semiconductor material using a second channeled implant with a second conductivity type. The first channeled implant disrupts a crystal structure of the first region of semiconductor material and does not disrupt a crystal structure of the second region of semiconductor material.

20 Claims, 20 Drawing Sheets

(51) Int. Cl.
*H10D 30/01* (2025.01)
*H10D 30/87* (2025.01)
*H10D 62/83* (2025.01)
*H10D 62/832* (2025.01)

(56) References Cited

U.S. PATENT DOCUMENTS

2016/0380117 A1 12/2016 Bhalla et al.
2017/0018657 A1* 1/2017 Li .................... H01L 21/045

OTHER PUBLICATIONS

H. Das, et al., "(Invited) P-type and N-type Channeling Ion Implantation of SiC and Implications for Device Design and Fabrication", ECS Transactions, 98 (6), 2020, Available at: https://iopscience.iop.org/article/10.1149/09806.0119ecst (Accessed on Mar. 21, 2022), pp. 119-124.

J. Wong-Leung, et al., "Effect of crystal orientation on the implant profile of 60 keV Al into 4H—SiC crystals", Mar. 6, 2003, Journal of Applied Physics, vol. 93, No. 11, Jun. 1, 2003, doi: 10.1063/1.1569972, Available at: http://dx.doi.org/10.1063/1.1569972 (Accessed on Dec. 10, 2014) pp. 8914-8917.

K. Mochizuki, et al., "Selection of ion species suited for channeled implantation to be used in multiepitaxial growth for SiC superjunction devices", Japanese Journal of Applied Physics 58, Apr. 8, 2019, Available at: https://doi.org/10.7567/1347-4065/ab08ae (Accessed on Apr. 16, 2019), pp. 050905-050905-4.

M.S. Janson, et al., "Channeled Implants in 6H Silicon Carbide", Materials Science Forum, vols. 338-342, May 2000, Available at: doi:10.4028/www.scientific.net/MSF.338-342.889, pp. 889-892.

* cited by examiner

RELATED ART
TRENCH JBS DIODE WITH WRAP-AROUND P+ 200

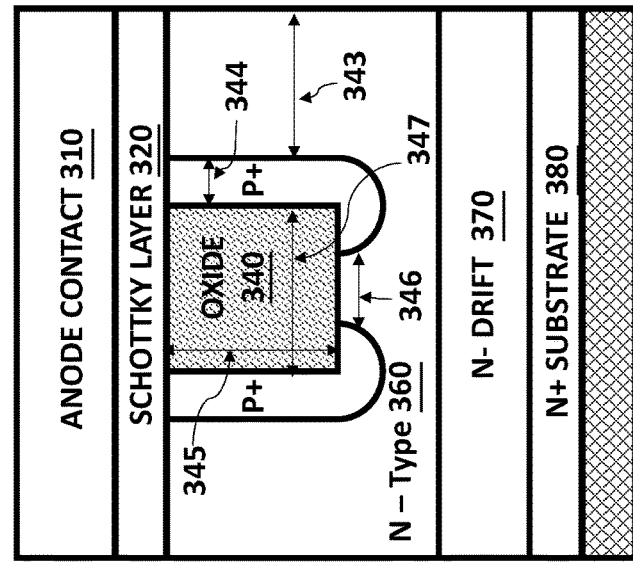
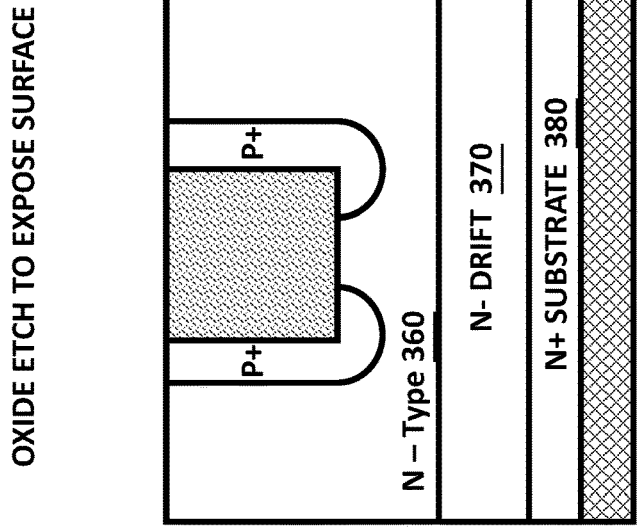
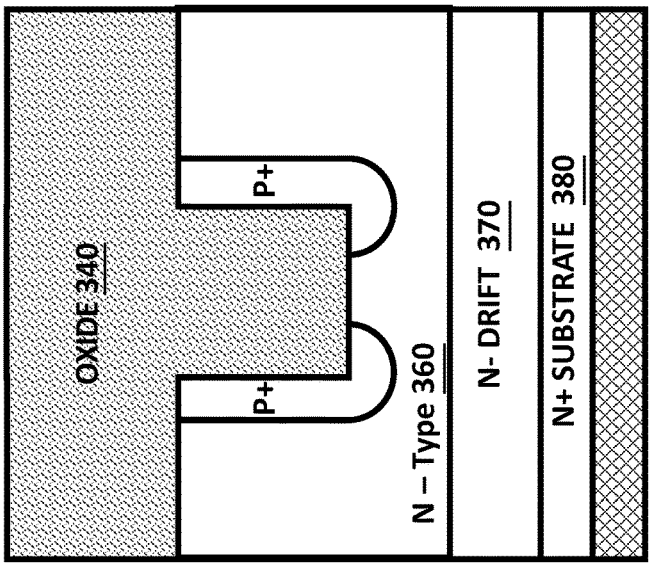
FIG. 8

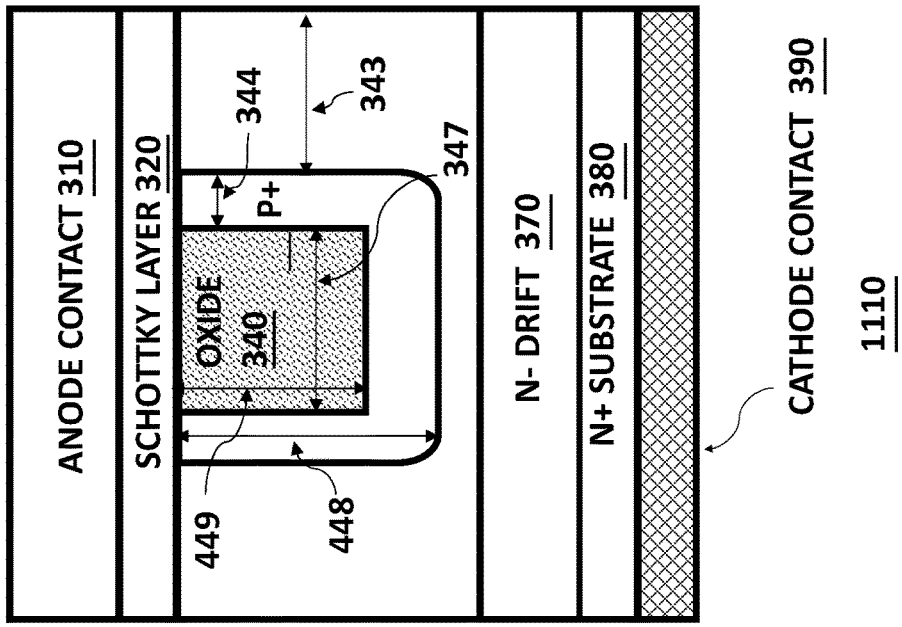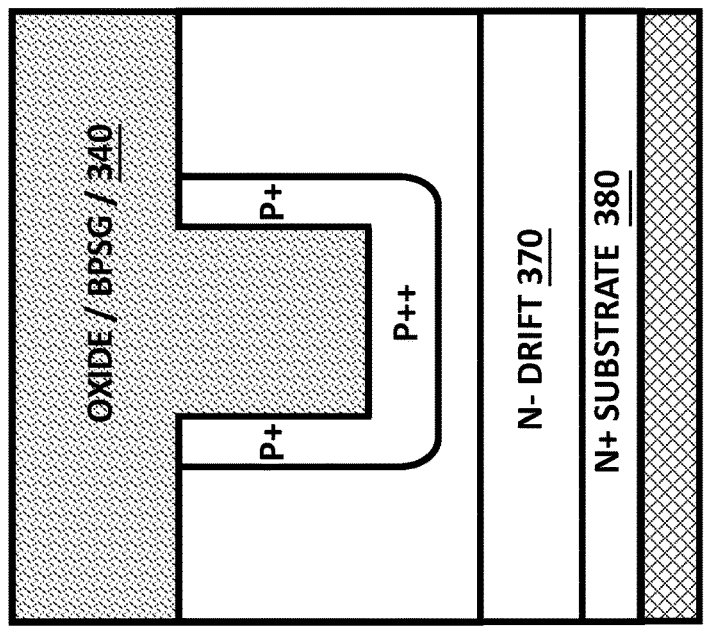
FIG. 11

FIG. 12 – HIGH-ENERGY P-WELL CHANNELING IMPLANT FLOW

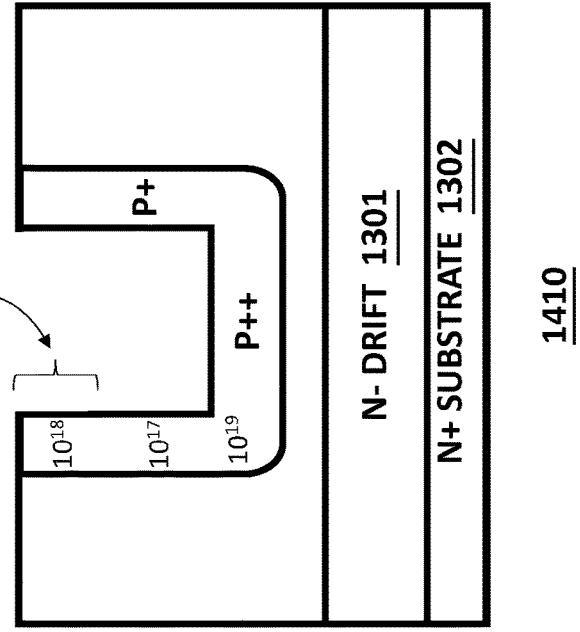
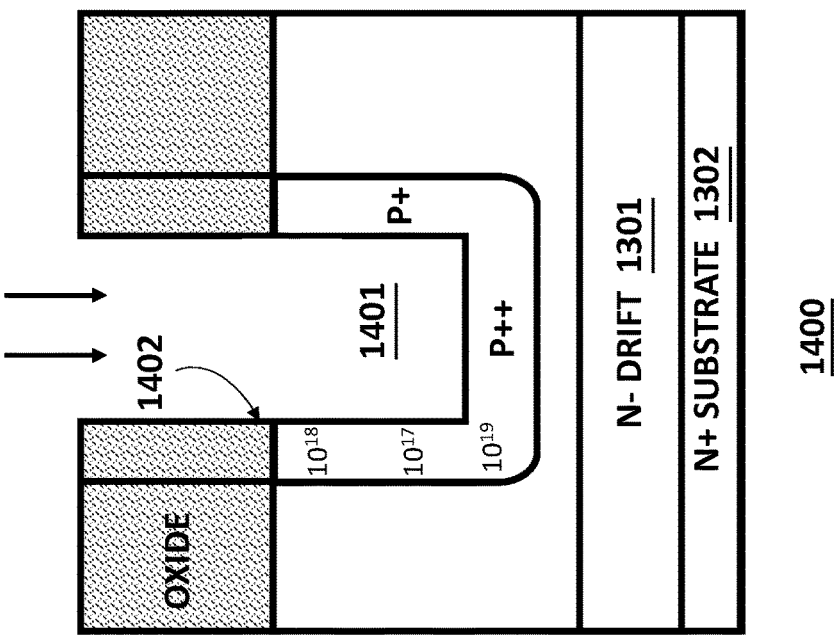
FIG. 14
- SPACER FORMATION
- SELF-ALIGNED TRENCH ETCH
- SELF-ALIGNED ZERO-TILT P+ IMPLANT AT TRENCH BOTTOM
- OXIDE STRIP

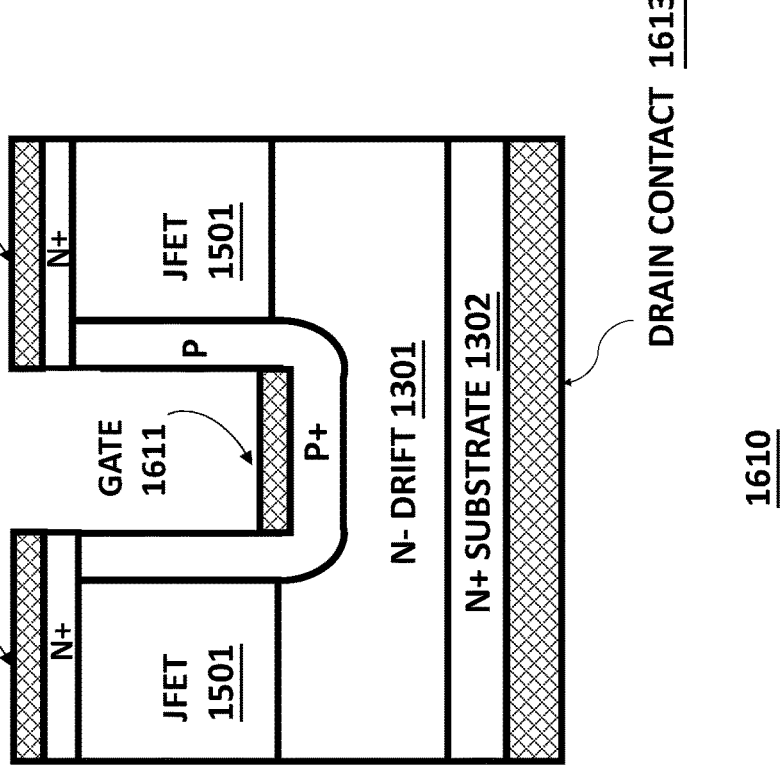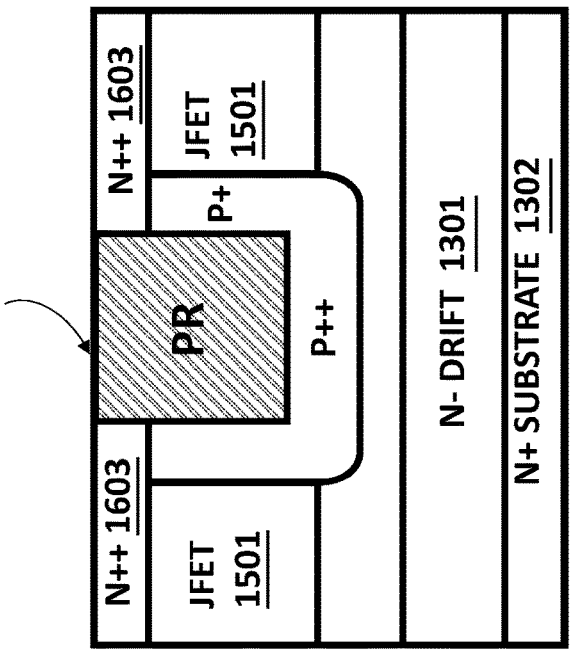
FIG. 16
- SELF-ALIGNED N+ SOURCE IMPLANT PHOTORESIST (PR) FILLED TRENCH
- GATE, SOURCE, AND DRAIN CONTACTS

- CATHODE CONTACT SILICIDE
- SCHOTTKY CONTACT
- ANODE CONTACT
- SELF-ALIGNED JFET CHANNELING IMPLANT

FIG. 18 - LOW TO MEDIUM ENERGY P-WELL CHANNELING IMPLANT FLOW

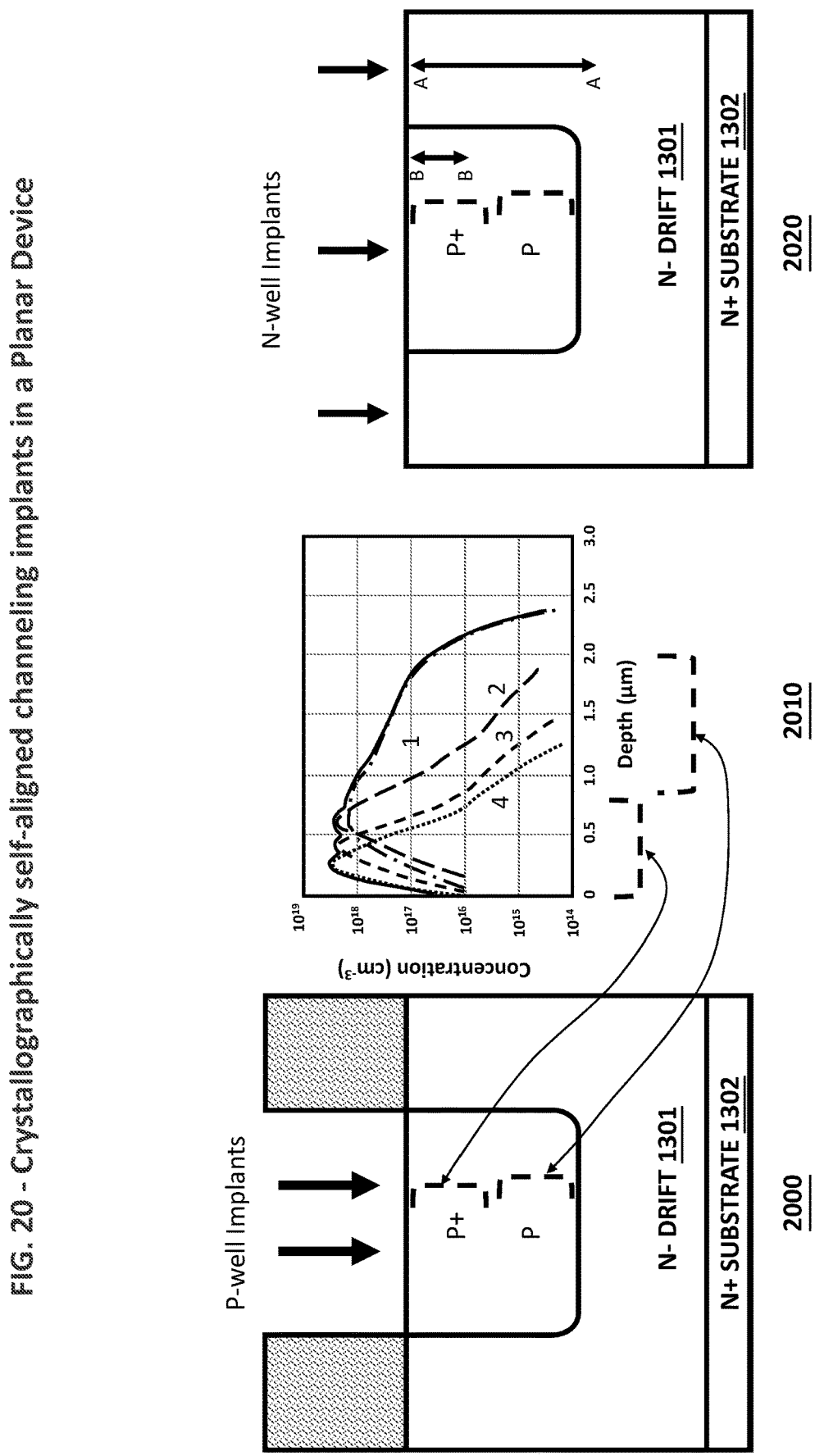
FIG. 20 - Crystallographically self-aligned channeling implants in a Planar Device

VERTICAL TRENCH DEVICE CONFIGURATIONS FOR RADIATION-ENVIRONMENT APPLICATIONS

CROSS REFERENCE TO RELATED APPLICATIONS

This application claims the benefit of U.S. Provisional Patent Application No. 63/336,575, filed on Apr. 29, 2022, which is incorporated by reference herein in its entirety for all purposes.

BACKGROUND

Semiconductor trench devices are devices in which a trench has been formed in the active layer of semiconductor material to form a feature of the device. An example of a semiconductor trench device is a vertical trench diode which can be explained through the comparison of a vertical planar diode in FIG. 1 and the vertical trench diode in FIG. 2.

A vertical planar diode 100 is shown in FIG. 1. The illustrated cross section is of a single cell of a design and can be replicated to the right and left of the illustrated portion to form a complete device. When the device is biased in the off-state, a depletion region extends from the P+ region 101 across the n-epi region 102 and overlaps with that of an adjacent cell, providing a potential barrier that covers the Schottky contact and suppresses the strong electric field at the Schottky interface. The Schottky contact is formed by the interface of Schottky layer 103 and n-epi region 102. In the illustrated case, the vertical planar diode 100 includes an anode contact 104 on a top side of a wafer and a cathode contact 105 on a back side of a wafer. When planar diode 100 is forward biased, a conductive path leads from the anode contact 104 through the n-drift region 106 and the N+ substrate region 107 to the cathode contact 105. The anode contact 104 can be various materials including aluminum or gold. The contact can have a thickness of 3 microns to 6 microns. The Schottky layer 103 which forms the Schottky contact can be various materials such as titanium or nickel silicide. The Schottky layer can have a thickness of 0.05 microns to 0.15 microns. The P+ region 101 can have a width 108 of 2 to 4 microns. The P+ region 101 can have a depth 109 of 2 to 4 microns. The Schottky barrier can have a half width 110 of 1 to 1.5 microns.

When subjected to heavy-ion radiation, reverse biased planar silicon carbide (Sic) Schottky power diodes of the type illustrated by FIG. 1 are prone to Single Event Burnout (SEB) at voltages that are a small fraction of the nominal breakdown voltages in the absence of radiation, and at bias voltages below the SEB threshold, show progressive leakage degradation. Leakage current at the Schottky layer to semiconductor junction and the P+ to n-epi junction are caused by thermal spikes induced by the synergy of a heavy-ion strike and applied bias voltage. The vertical planar diode's large surface area of the P+ to n-epi junction increases the device's sensitivity to ion strike-induced SEB. The surface area is defined in part by the width 108 in FIG. 1. In certain approaches that are in accordance with FIG. 1, the fraction of the P+ to n-epi surface area as a fraction of the die area is 61%.

A vertical trench diode 200 is shown in FIG. 2. In the illustrated approach, P+ dopant along the trench sidewall extends from the top of the trench to the bottom of the trench. P+ dopant is present at the bottom of the trench, providing a planar P+ to N-Epi junction in addition to a vertical P+ to n-epi junction inside the trench pillar. When the device is biased in the off-state, the depletion region extends from the P+ region along the trench sidewall and at the bottom of the trench across the n-epi region 260 and overlaps, providing a potential barrier that covers the Schottky contact and suppresses the strong electric field at the Schottky interface. When diode 200 is forward biased, the Schottky barrier formed by Schottky layer 211 and n-epi region 260 provides for a conductive path to lead from the anode contact 210 through the n-drift region 270 and the N+ substrate region 280 to the cathode contact 290. The anode contact 210 can be various materials including aluminum or gold. The contact can have a thickness of 3 microns to 6 microns. The Schottky layer 211 which forms the Schottky contact can be various materials such as titanium or nickel silicide. The Schottky layer 211 can have a thickness of 0.05 microns to 0.15 microns. The P+ region can have a width 242 of 2 to 3 microns. The P+ region can have a depth 241 of 1.5 to 2.5 microns. The Schottky barrier can have a half width 243 of 1 to 1.5 microns.

When subjected to heavy-ion radiation, reverse biased vertical trench diodes of the type illustrated by FIG. 2 are prone to SEB at a low threshold due to the presence of large junction area of P+ to N, and at bias voltages below the SEB threshold, show progressive leakage degradation due to radiation damage-induced heating of the junctions. Leakage current at the Schottky metal to Semiconductor junction and P+ to n-epi junction are caused by thermal spikes induced by the synergy of a heavy-ion strike and applied bias voltage. The large surface area of the P+ to n-epi junction present at the bottom of the trench diode increases the device's sensitivity to ion strike-induced SEB, similar to a vertical planar diode. In certain approaches that are in accordance with FIG. 2, the fraction of the P+ to n-epi surface area as a fraction of the die area is 64%.

SUMMARY

Semiconductor trench devices and associated fabrication methods are disclosed herein. The trench devices can be junction field effect transistors (JFETs) such as vertical JFETs. The JFETs can be normally-on JFETs. The trench devices can be vertical trench diodes. The diodes can be junction barrier Schottky (JBS) diodes such as vertical JBS diodes. In specific embodiments of the inventions disclosed herein, the vertical trench diodes are designed for radiation-environment applications. In specific embodiments, the diodes exhibit various features selected from: a single event burnout (SEB) resistance of greater than 400 volts, a 1200 volt to 2200 volts breakdown voltage, a nominal forward current rating of 1 amp to 40 amps, a forward bias voltage of less than 2 volts with a current of 100 amperes per centimeter squared, and a specific on resistance in milliohms per centimeter squared of less than 5. The trench devices could also be metal-oxide-semiconductor field-effect transistor (MOSFET) devices such as vertical MOSFET devices.

The trench devices disclosed herein can be formed in silicon carbide or silicon substrates. The trench devices can include regions of a first conductivity type and regions of a second, opposite conductivity type. The regions of different conductivity can be formed by doping the substrate materials with various dopants such as aluminum, phosphorus, and nitrogen for silicon carbide, and boron, phosphorus, and arsenic for silicon. Example levels of conductivity types provided with reference to a well dopant region formed in a drift region and a heavily doped region (i.e., N+ or P+ region) formed in a drift region on a substrate include: a P+ region at $5\times10^{18}$ cm$^{-3}$ to $1\times10^{20}$ cm$^{-3}$, a p-well region (well doping or PW) at $1\times10^{17}$ cm$^{-3}$ to $4\times10^{18}$ cm$^{-3}$, and an n-drift region at $1\times10^{15}$ cm$^{-3}$ to $5\times10^{16}$ cm$^{-3}$.

The vertical trench diodes disclosed herein can be Schottky diodes formed through the interface of a metal layer with the semiconductor materials mentioned above. The metals can be titanium or nickel silicide for silicon carbide, or cobalt silicide or nickel silicide for silicon.

The various materials that form the trench device can be deposited through various methods such as by plasma-assisted sputtering, physical vapor deposition, evaporation, chemical vapor deposition, and atomic layer deposition. The methods can be conducted with or without subsequent thermal reaction depending on the material.

The vertical trench diodes disclosed herein can include fingers where each of the illustrated cross sections in this disclosure is of a single finger of the diode. The finger widths can be between 2 microns and 5 microns. The space between the fingers can be between 1 micron and 3 microns. The lengths of the fingers can be between 100 microns and 500 microns.

In specific embodiments of the inventions disclosed herein, the devices can be made by first doping a region of semiconductor material and subsequently forming a trench in the doped region of semiconductor material.

In specific embodiments of the inventions disclosed herein, a process for forming a semiconductor device, with a well region, is provided. The process comprises implanting a first region of semiconductor material using a first implant and a first mask, forming, after the first implant, at least one spacer on the first mask, and forming a trench in the first region of semiconductor material using the at least one spacer and the first mask. The well region of the semiconductor device occupies at least a portion of the first region of semiconductor material that was implanted with the first implant.

In specific embodiments of the inventions disclosed herein a process for forming a semiconductor device with a well region is provided. The process includes: implanting a first region of semiconductor material using a first implant and a first mask; forming, after the first implant, at least one spacer on the first mask; and forming a trench in the first region of semiconductor material using the at least one spacer and the first mask. The well region of the semiconductor device occupies at least a portion of the first region of semiconductor material that was implanted with the first implant.

In specific embodiments of the inventions disclosed herein a process for forming a semiconductor device is provided. The process comprises: implanting a first region of semiconductor material using a first channeled implant with a first conductivity type; and implanting, after the first channeled implant, a second region of semiconductor material using a second channeled implant with a second conductivity type. The first channeled implant disrupts a crystal structure of the first region of semiconductor material and does not disrupt a crystal structure of the second region of semiconductor material.

In specific embodiments of the inventions disclosed herein a process for forming a semiconductor device with a well region and a junction field effect region are provided. The process comprises: implanting a first region of semiconductor material using a first non-channeled implant with a first conductivity type; forming, after the first non-channeled implant, a trench in the first region of semiconductor material; and implanting, after forming the trench, a second region of semiconductor material using a second channeled implant with a second conductivity type. The well region of the semiconductor device occupies at least a portion of the first region of semiconductor material that was implanted with the first non-channeled implant, the junction field effect region of the semiconductor device occupies at least a portion of the second region of semiconductor material that was implanted with the second channeled implant, and the portion of the first region of semiconductor material has a higher dopant concentration than the portion of the second region of semiconductor material.

In specific embodiments of the inventions disclosed herein a trench junction barrier Schottky diode is provided. The diode comprises: an anode contact; a cathode contact; a Schottky region located between the anode contact and the cathode contact; a first semiconductor region having a first conductivity type; an insulator region; a pair of semiconductor regions having a second conductivity type and each in contact with the Schottky region, the insulator region, and the first semiconductor region; and a gap between the pair of semiconductor regions on a bottom side of the insulator region.

In specific embodiments of the inventions disclosed herein a trench junction field effect transistor is provided. The field effect transistor comprises: a trench; a gate region having a first conductivity type formed along a sidewall of the trench by a channeled well implant and a non-channeled well implant before the trench is formed; a gate contact region having the first conductivity type and formed at a bottom of the trench; a self-aligned source region having a second conductivity type; a drain region; and a junction field effect region of the second conductivity type formed by channeled and non-channeled implants between the self-aligned source region and the drain region.

BRIEF DESCRIPTION OF THE DRAWINGS

The accompanying drawings illustrate various embodiments of systems, methods, and embodiments of various other aspects of the disclosure. A person with ordinary skills in the art will appreciate that the illustrated element boundaries (e.g., boxes, groups of boxes, or other shapes) in the figures represent one example of the boundaries. It may be that in some examples one element may be designed as multiple elements or that multiple elements may be designed as one element. In some examples, an element shown as an internal component of one element may be implemented as an external component in another and vice versa. Furthermore, elements may not be drawn to scale. Non-limiting and non-exhaustive descriptions are described with reference to the following drawings. The components in the figures are not necessarily to scale, emphasis instead being placed upon illustrating principles

FIG. 8 illustrates three cross sections of a seventh, eighth, and ninth processing step in a process for forming a device such as those represented in FIG. 3 in accordance with specific embodiments of the inventions disclosed herein.

FIG. 11 illustrates two cross sections of a seventh and eighth processing step in a process for forming a device such as those represented in FIG. 4 in accordance with specific embodiments of the inventions disclosed herein.

FIG. 14 illustrates cross sections of processing steps in the flow chart of FIG. 12 in accordance with specific embodiments of the inventions disclosed herein.

FIG. 16 illustrates a cross section of a processing step in the flow chart of FIG. 12 and a cross section of a normally on junction field effect transistor formed using processing steps in the flow chart of FIG. 12 in accordance with specific embodiments of the inventions disclosed herein.

FIG. 20 illustrates cross sections of processing steps for a crystallographically self-aligned channel in a planar device and an accompanying chart of doping concentrations in a portion of those cross sections in accordance with specific embodiments of the inventions disclosed herein.

DETAILED DESCRIPTION

Reference will now be made in detail to implementations and embodiments of various aspects and variations of systems and methods described herein. Although several exemplary variations of the systems and methods are described herein, other variations of the systems and methods may include aspects of the systems and methods described herein combined in any suitable manner having combinations of all or some of the aspects described.

Semiconductor trench devices and associated fabrication methods in accordance with the summary above are disclosed in detail herein. The methods and systems disclosed in this section are nonlimiting embodiments of the invention, are provided for explanatory purposes only, and should not be used to constrict the full scope of the invention. It is to be understood that the disclosed embodiments may or may not overlap with each other. Thus, part of one embodiment, or specific embodiments thereof, may or may not fall within the ambit of another, or specific embodiments thereof, and vice versa. Different embodiments from different aspects may be combined or practiced separately. Many different combinations and sub-combinations of the representative embodiments shown within the broad framework of this invention, that may be apparent to those skilled in the art but not explicitly shown or described, should not be construed as precluded.

Figure 1:
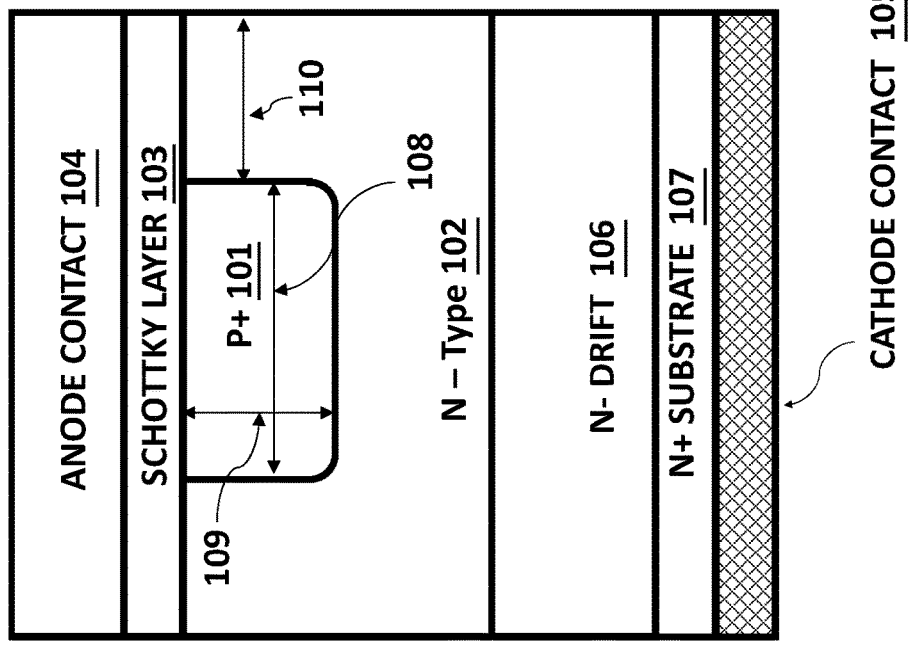
FIG. 1 illustrates a cross section of a vertical planar diode device in accordance with the related art.
Figure 2:
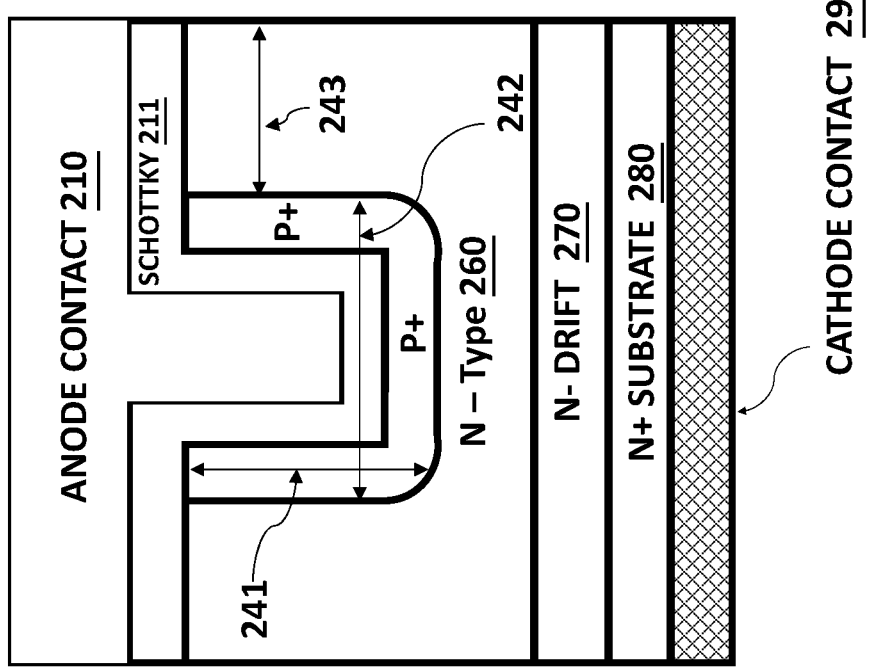
FIG. 2 illustrates a cross section of a vertical trench diode device in accordance with the related art.
Figure 3:
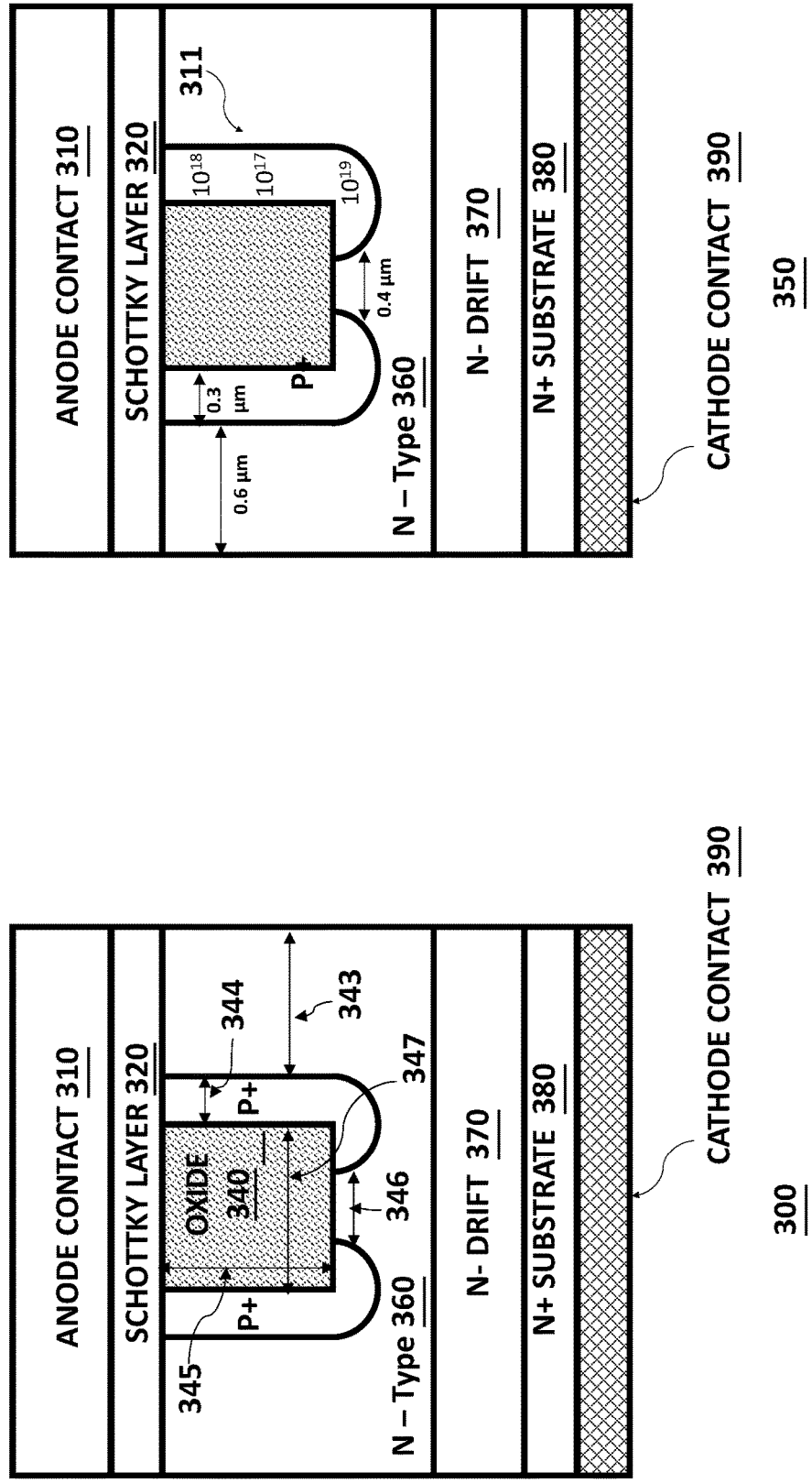
FIG. 3 illustrates a cross section of a vertical trench diode device in accordance with specific embodiments of the inventions disclosed herein.

A vertical trench diode 300 is shown in FIG. 3. The illustrated cross section is of a single cell of a design and could be replicated to the right and left of the illustrated portion in order to form a complete device. Each cell could be a finger as described in the summary above. Contacts between the P+ region and the Schottky layer 320 are formed at the top surface of the device. The anode contact 310 and cathode contact 390 can have similar characteristics to those of anode contact 104 and cathode contact 105. Example dimensions of the trench depth 345 is from 0.5 micron to 3.0 microns, the pillar width is from 1.0 micron to 3.1 microns, and trench width 347 is from 0.5 micron to 3.0 microns. Here the term "pillar" refers to the mesa of material between adjacent sidewall regions and includes the doped sidewall regions of the trenches. The width of the P+ spacer region 344 can be about 0.5 microns and can be 0.3 microns as is shown in cross section 350. The trench width 347 can be around 1 micron to 2 microns. The P+ depth, measured from the Schottky layer 320 down towards the n-drift region 370 can be around 0.5 to 1 microns. Schottky barrier can have a half width 343 of 1 to 2 microns.

P+ dopant along the trench sidewall extends from the top of the trench to the bottom of the trench. Cross section 350 shows vertical trench diode 300 overlain with an illustration of potential p-type dopant concentrations in the P+ dopant sidewall region 311. Cross section 350 also provided a specific example of the dimensions that can be used for the various portions of the device. The illustrated cross section is of a single cell of a design and would be replicated to the right and left of the illustrated portion several times in order to form a complete device. Trench bottom edges can be selectively doped with P+ dopant after trench etch. A portion of the trench's flat bottom is devoid of P+ dopant, limiting the area of P+ to n-epi junction in the horizontal direction of the device structure. This region can be referred to as a gap in the p-well region and has a width 346. This region can have a width 346 of 0.4 to 1.4 microns and can be 0.4 microns as shown in cross section 350.

When the device is biased in the off state, the depletion region extends from the P+ region along the trench sidewall and overlaps with that of an adjacent cell, providing a potential barrier that covers the Schottky contact and suppresses the strong electric field at the Schottky interface. Furthermore, when subjected to heavy-ion radiation, reverse biased vertical trench diodes may display higher threshold voltages for SEB and leakage degradation. Leakage current at the Schottky metal to semiconductor junction and P+ to n-epi junction are caused by thermal spikes induced by the synergy of a heavy-ion strike and applied bias voltage. The reduced surface area of the P+ to n-epi junction in the vertical trench diode of verticle trench diode 300 decreases the device's sensitivity to ion strike-induced SEB, thus making the device radiation tolerant. For example, the fraction of the P+ to n-epi surface area as a fraction of the die area is 37%. For comparison, a design using the planar diode 100 could have a die area of 2.54 millimeters squared and an active Schottky area of 1.05 millimeters squared resulting in a P+ to n-epi surface area of 61%. A design using the planar diode of device 200 could have the same die area and active Schottky area with a P+ to n-epi surface area of 64%, while verticle trench diode 300 could have the same die area and active Schottky area with a P+ to n-epi surface area of only 37%. Accordingly, in verticle trench diode 300, as compared to planar diode 100 and device 200, the probability of ion-induced single event burnout at the P+ to n-epi interface is reduced by 40%.

In specific embodiments of the invention, a device in the form of a trench JBS diode is provided. The device includes an anode contact (such as anode contact 310) and a cathode contact (such as cathode contact 390). The device includes a Schottky region located between the anode contact and the cathode contact (such as Schottky layer 320). For example, the device in FIG. 3 includes a Schottky layer 320 located between anode contact 310 and cathode contact 390. The device also includes a first semiconductor region having a first conductivity type. For example, the device in FIG. 3 includes an n-type epi region 360. The device also includes an insulator region. For example, the device in FIG. 3 includes an oxide 340. The device also includes a pair of semiconductor regions having a second conductivity type and each in contact with the Schottky region, the insulator region, and the first semiconductor region. For example, the device in FIG. 3 includes two P+ regions located on either side of oxide 340. These regions are biased via the Schottky layer 320. As such, it is important to have a high doping concentration in these regions proximate to the Schottky layer 320 to assure good ohmic contact for biasing the regions. The two regions may be portions of a contiguous region that connects outside the plane of the page. When the device is off, the two regions form the basis of a depletion region that extends from one cell of the device to the next and completely blocks the Schottky layer 320 from any conductive path to cathode contact 390. The device also includes a gap between the pair of semiconductor regions on a bottom side of the insulator region. For example, the device in FIG. 3 includes a gap indicated by width 346 between the two P+ regions on a bottom side of oxide 340. In specific embodiments, the insulator region of the device is in contact with the first semiconductor region at the gap. For example, the oxide 340 in the device in FIG. 3 is in contact with the first semiconductor region 360 at the gap measured by width 346. The fact that the two P+ regions do not cover the bottom of the oxide 340 provides certain benefits such as a decrease in the device's sensitivity to ion strike-induced SEB as described above.

Figure 4:
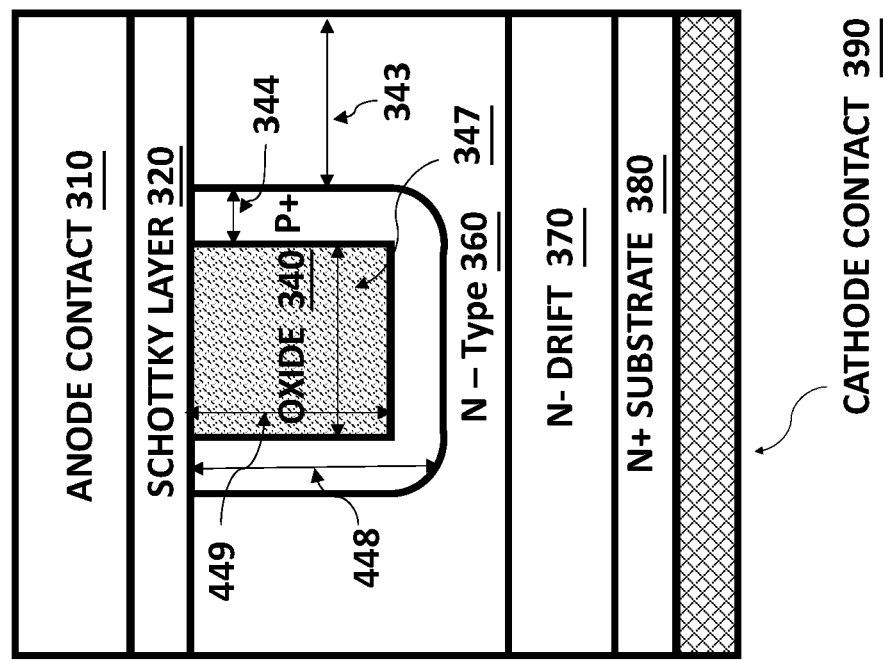
FIG. 4 illustrates a cross section of a vertical trench diode device without a gap below the oxide in accordance with specific embodiments of the inventions disclosed herein.

FIG. 4 illustrates a cross section of a vertical trench diode device 400 without a gap below the oxide in accordance with specific embodiments of the inventions disclosed herein. Reference labels from FIG. 3 are reused in FIG. 4 when they refer to regions and dimensions with similar characteristics to those in FIG. 3. Contacts to P+ and the Schottky region are formed at the top surface of the device. The trench depth 449 is from 0.5 microns to 3.0 microns, pillar width is from 1.0 micron to 3.1 microns, and trench width 347 is from 0.5 micron to 3.0 microns. The P+ depth 448 is from 0.7 microns to 1 micron. P+ dopant along the trench sidewall extends from the top of the trench to the bottom of the trench. The bottom of the trench is fully confined within the P-region. An optional P-type implant may be used at the bottom of the trench to provide improved shielding of the Schottky barrier. When the device is biased in the off state, the depletion region extends from the P+ region along the trench bottom, sidewalls and overlaps with an adjacent cell, providing a potential barrier that covers the Schottky contact and suppresses the strong electric field at the Schottky interface. Furthermore, when subjected to heavy-ion radiation, reverse biased vertical trench diodes as in the first design example may display higher threshold voltages for SEB and leakage degradation. Leakage current at the Schottky metal to semiconductor junction and P+ to n-epi junction are caused by thermal spikes induced by the synergy of the heavy-ion strike and applied bias voltage. The robust shielding of the Schottky barrier in the second example vertical trench diode decreases the device's sensitivity to ion strike-induced SEB, thus making the device radiation tolerant.

Figure 5:
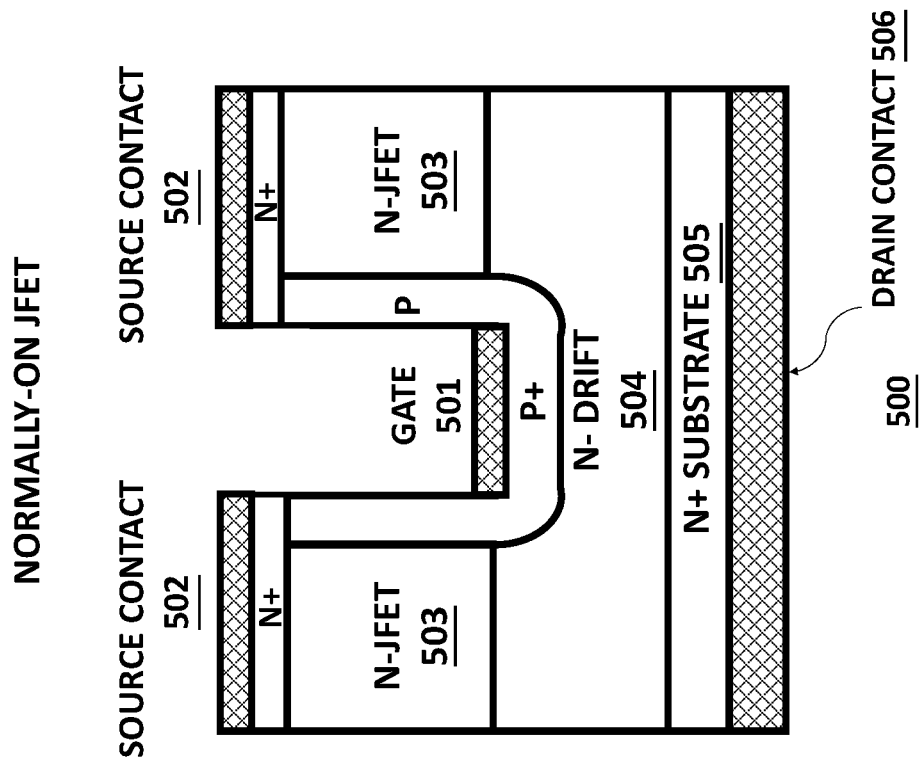
FIG. 5 illustrates a cross section of a vertical trench junction field effect transistor in accordance with specific embodiments of the inventions disclosed herein.

FIG. 5 illustrates a cross section of a vertical trench JFET 500. Contact to P+ Gate 501 is formed at the bottom of the trench and the N+ Source region is formed at the top surface of the device with a source contact 502 to bias the N+ source region. Each N+ source region is in contact with N-JFET region 503, which are in turn in contact with n-drift region. When the device is on, current flows from the source contact 502 to the drain contact 506 through the N+ substrate region 505. Example dimensions of the trench depth is from 0.5 microns to 3.0 microns, pillar width is from 1.0 micron to 3.1 microns, and trench width is from 0.5 micron to 3.0 microns. P+ dopant along the trench sidewall extends from close to the top of the trench to the bottom of the trench. The bottom of the trench is fully confined within the P-region. An optional P-type implant may be used at the bottom of the trench to provide improved ohmic contact to the P+ Gate. When the device is biased in the off state, the depletion region extends from the P+ region along the trench bottom, sidewalls and overlaps with an adjacent cell, depleting the n-type channel region and thus blocking the conductive path between the N+ Source and N+ Drain (which in this case is n-drift region 504). Precise dopant control of the P-region below the N+ source allows superior control of Gate-to-Source breakdown voltage. Furthermore, when subjected to heavy-ion radiation, reverse biased vertical trench JFET devices may display higher threshold voltages for SEB and leakage degradation. Leakage currents between N+ Source and N+ Drain are caused by thermal spikes induced by the synergy of the heavy-ion strike and applied bias voltage. The robust pinch-off of the channel region in the third example vertical trench JFET decreases the device's sensitivity to ion strike-induced SEB, thus making the device radiation tolerant. Devices in accordance with this description can be formed using the processes described below and offer significant benefits compared to prior art approaches, such as the formation of a strong P+ region near the source region using a zero-degree implant such that the gate to source breakdown voltage of the device can accordingly be well controlled.

Figure 6:
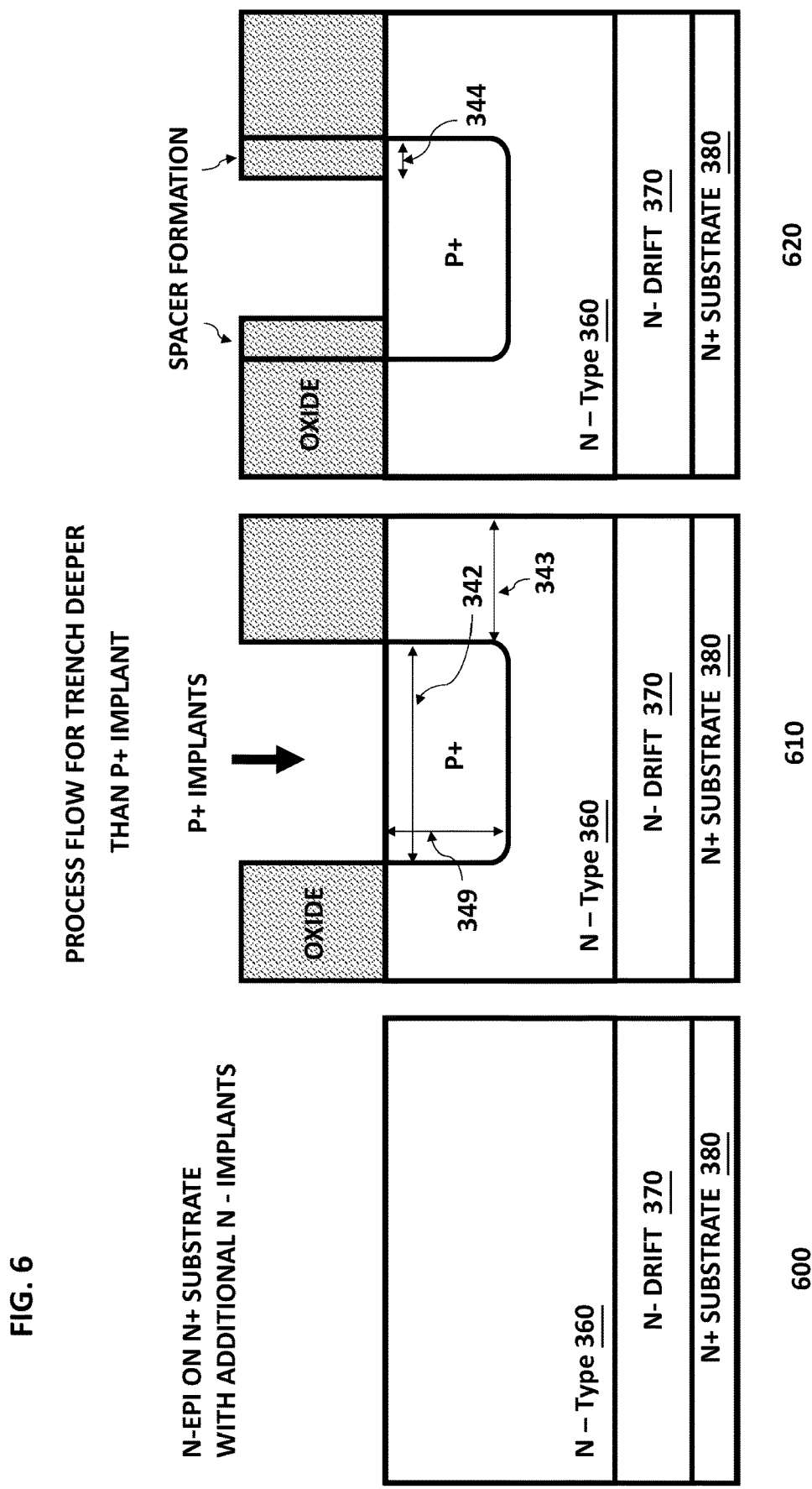
FIG. 6 illustrates three cross sections of a first, second, and third processing step in a process for forming a device such as those represented in FIG. 3 in accordance with specific embodiments of the inventions disclosed herein.
Figure 7:
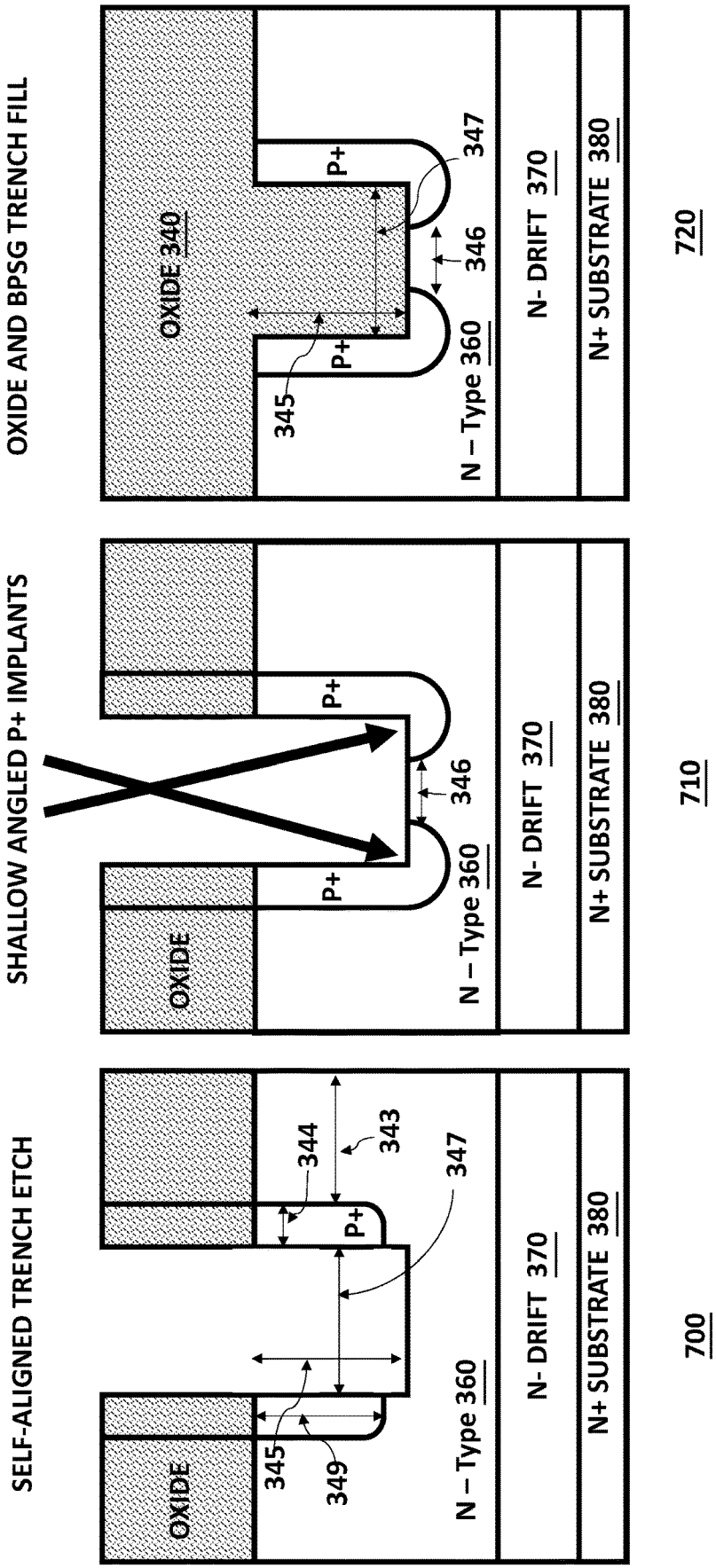
FIG. 7 illustrates three cross sections of a fourth, fifth, and sixth processing step in a process for forming a device such as those represented in FIG. 3 in accordance with specific embodiments of the inventions disclosed herein.

Process steps involved in the fabrication of the device in FIG. 3 are shown in FIG. 6 through FIG. 8. Similar reference numbers are used from FIG. 3 when they refer to areas or dimensions with similar characteristics. Cross section 600 shows a starting wafer which consists of an n-type epi region 360 on top of an n-drift region 370 region and N+ substrate 380. The starting wafer can be a silicon carbide or silicon wafer. A box-like profile of p-type region is formed by a series of P+ implants using an oxide mask as shown in cross section 610. The depth of the P+ region 349 can be 0.5 microns to 1 micron across the width of the P+ region 342. Intentional channeling of multiple aluminum implants to a depth of 1.0 micron to 2.5 microns can be used to create box-like implant profiles with P-type dopant concentrations ranging between $10^{19}$ cm$^{-3}$ near the surface to greater than $10^{17}$ cm$^{-3}$ at 2.0 microns depth. An oxide spacer is formed and shown in cross section 620, followed by a trench etch, self-aligned to the P+ implanted region at the bottom edges or the bottom of the trench. Trench depth in this device example exceeds the depth of the P+ doped region, as shown in cross section 700 in FIG. 7. An angled P-type implant ensures fully doped trench bottom edges, as shown in cross section 710. To define the device termination region, additional photomask and implant steps may be required. Following the completion of all implant steps in the process flow, the dopant activation anneal is performed and the wafer surface is coated with an insulator such as silicon oxide (SiO$_2$) as shown in cross section 720 and/or boro-phospho-silicate glass (BPSG). With the wafer front side fully protected, ohmic contact is formed to the wafer backside as shown in cross section 800. Insulator on the frontside is partly removed to expose the top silicon carbide surface as shown in cross section 810. Schottky anode contact to n-epi and contact to P+ region are then formed at the top surface as shown in cross section 820. The trench filled with insulator such as SiO$_2$ and BPSG is estimated to have a dielectric field strength of 700-800 V/μm. For example, a 2 μm deep trench in the example of FIG. 3 will withstand 1400 V before oxide undergoes electrical breakdown. Devices made in accordance with this process can produce JBS diodes rated at 1000 V, which is far below the dielectric breakdown of SiO$_2$ and BPSG in the deep trench. Furthermore, in the reverse bias mode, space charge regions from the P+ expand and merge at the bottom of the trench, further shielding the trench dielectric from high electric fields.

Figure 9:
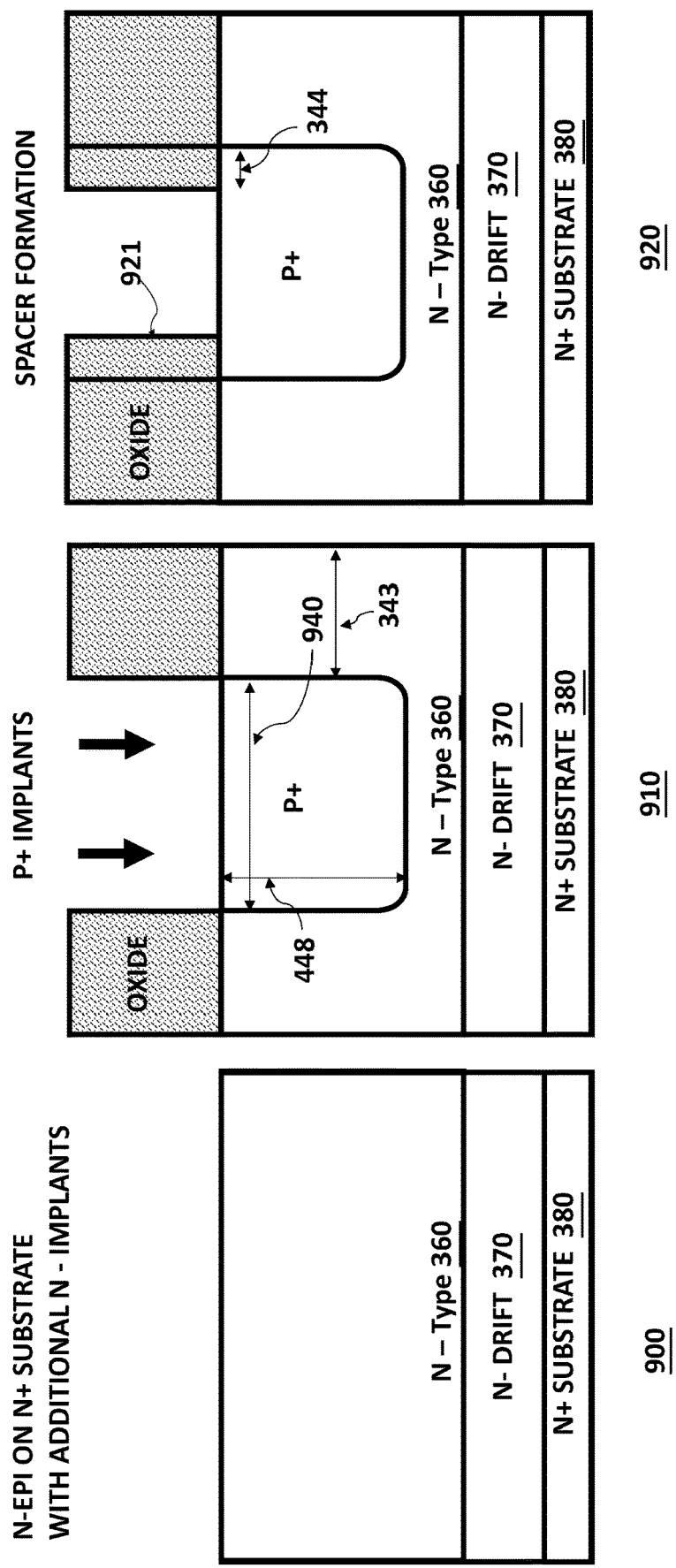
FIG. 9 illustrates three cross sections of a first, second, and third processing step in a process for forming a device such as those represented in FIG. 4 in accordance with specific embodiments of the inventions disclosed herein.
Figure 10:
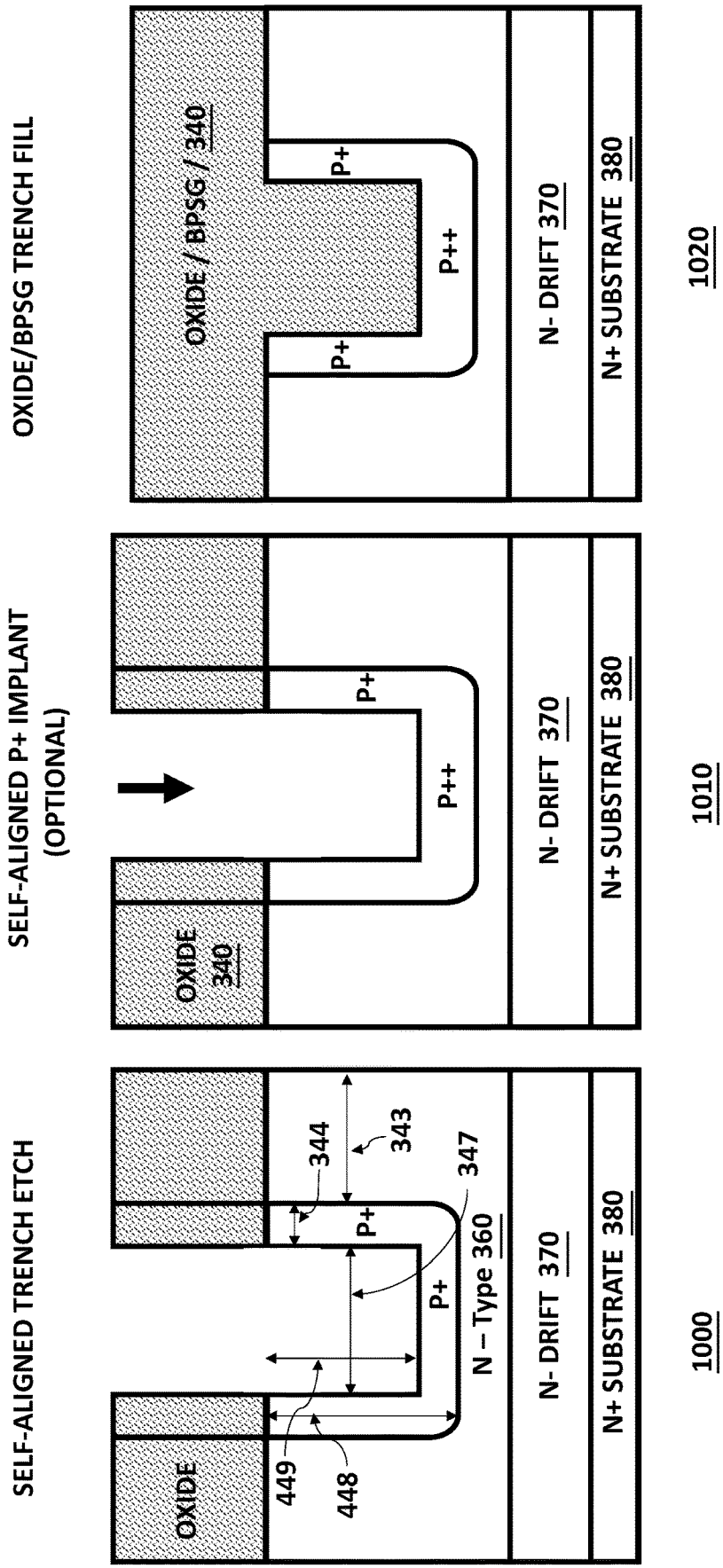
FIG. 10 illustrates three cross sections of a fourth, fifth, and sixth processing step in a process for forming a device such as those represented in FIG. 4 in accordance with specific embodiments of the inventions disclosed herein.

Process steps involved in the fabrication of the device in FIG. 4 are shown in FIG. 9 through FIG. 11. Similar reference numbers are used from FIGS. 3 and 4 when they refer to areas or dimensions with similar characteristics. Cross section 900 shows a starting wafer which consists of an n-type epi region 360 on top of an n-drift region 370 and N+ substrate 380. A box-like profile of P-type region is formed by a series of P+ implants using an oxide mask as shown in cross section 910. Intentional channeling of multiple aluminum implants to a depth of 1 to 2.5 microns can be used to create box-like implant profiles with P-type dopant concentrations ranging from $10^{19}$ cm$^{-3}$ near the surface to greater than $10^{17}$ cm$^{-3}$ at 2.0 microns depth. The width of the P-type region formed is shown by reference 940. The region can have a width of 1 to 2 microns. An oxide spacer 921 is then formed as shown in cross section 920, followed by trench etch, self-aligned to the P+ implanted region as shown in cross section 1000 in FIG. 10. Trench depth in this device example is shallower than the depth of the P+ doped region, as shown in cross section 1000. An optional P+ implant as shown in cross section 1010, may be performed to increase the P-region dopant concentration to greater than $10^{19}$ cm$^{-3}$ at the bottom of the trench. To define the device termination region, additional photomask and implant steps may be required. Following the completion of all implant steps in the process flow, the dopant activation anneal is performed and the wafer surface is coated with an insulator such as silicon oxide (SiO$_2$) and/or BPSG as shown in cross section 1020. With the wafer front side fully protected, ohmic contact is formed to the wafer backside as shown in cross section 1100 in FIG. 11. The insulator, such as oxide, on the frontside is then partly removed to expose the top semiconductor surface as shown in cross section 1110. An anode contact 310 to n-epi and contact to P+ region is then formed at the top surface, as shown in cross section 1110. In the reverse bias mode, space charge regions from the P+ expand and merge at the bottom of the trench, further shielding the trench dielectric from high electric fields.

A process for forming a semiconductor device in accordance with this disclosure can include forming a trench that is self-aligned to the well region of the device. In specific embodiments, such as in the case of JBS diodes, the well region can be a region that is biased to shield the Schottky region of the device when the device is biased in the off state as described above. Related processes can involve a step of implanting a first region of semiconductor material using a first implant and a first mask. For example, the implant could be as shown in cross section 610 in which a P+ region is implanted using a mask. The processes can also involve a step of forming, after the first implant, at least one spacer on the first mask. For example, in cross section 620, a spacer with two spacer portions on either side of the gap in the mask are shown being formed on the mask from cross section 610. The process can also involve a step of forming a trench in the first region of semiconductor material using at least one spacer and the first mask. For example, in cross section 700, the two spacer portions and mask from cross section 620 are used to form a trench. In specific embodiments of the inventions disclosed herein, a well region of the resulting semiconductor device can occupy at least a portion of the first region of semiconductor material that was implanted with the first implant. For example, as illustrated in the finished device in cross section 820, the two regions of P+ material serve as the well region of the device and they occupy a portion of the region that was initially implanted in cross section 610. The result of this process can be a trench that is self-aligned to the well regions of the device.

In specific embodiments of the inventions disclosed herein, the implant steps disclosed herein can involve the use of channeled-ion implantation. As used herein, an implant that results in channeled-ion implantation can be referred to as a channeled implant. Ion channeling can happen in crystalline samples when the incident direction of an ion beam is aligned with a particular axis of the crystal. The ions can travel through channels between atom rows or planes driven by the interaction between the charged ion and the potential induced by the arrangement of the target atoms. This results in a decrease in the number of collisions and an increase in the implantation depth. Channeling can result in deeper ion travel (ion range) compared to non-channeled ions. In most applications, channeling is undesirable in semiconductor processing. The relevant parameters while considering ion channeling are the angle of the ion beam with respect to the crystal orientation, the ion species, the ion energy, the crystalline structure, and the surface cleanliness of the wafer. For a particular crystalline axis, only ions incoming within a certain angle can penetrate the channeling rows. This angle is called the critical angle. If the ion velocity is reduced, channeling also does not happen below the so-called critical ion energy for channeling. A given wafer's propensity to allow channeling can also change through the course of processing. For example, if a crystal structure of a wafer is sufficiently damaged during an implant process itself, channeling stops. This is because the damaged crystal structure no longer includes channels through which channeling could occur. When channeling does occur, the depth of channeled ions can be four times or greater compared to unchanneled implants for the same implant species, dose, and energy. Factors that mitigate the channeling of ions include an ion beam that is not properly aligned to the substrate and a defective crystal structure which prevents channeling. For example, implant damage from a previous process step can create crystal damage and prevent channeling. A summary of how various conditions will or will not result in a channeling implant is presented in the table below with the crystal quality, beam alignment, and ion dose as inputs, and the channeling result as an output.

| Crystal Quality | Beam Alignment | Ion Dose | Channeling Result |
| --- | --- | --- | --- |
| Perfectly Crystalline | Aligned to Substrate | Low | Channels |
| Perfectly Crystalline | Aligned to Substrate | High | Initially channels, but clamps and stops |
| Perfectly Crystalline | Off-aligned to Substrate | Low to High | No channeling |
| Defective Crystal | Aligned to Substrate | Low to High | No channeling |
| Defective Crystal | Off-aligned to Substrate | Low to High | No channeling |

Figure 12:
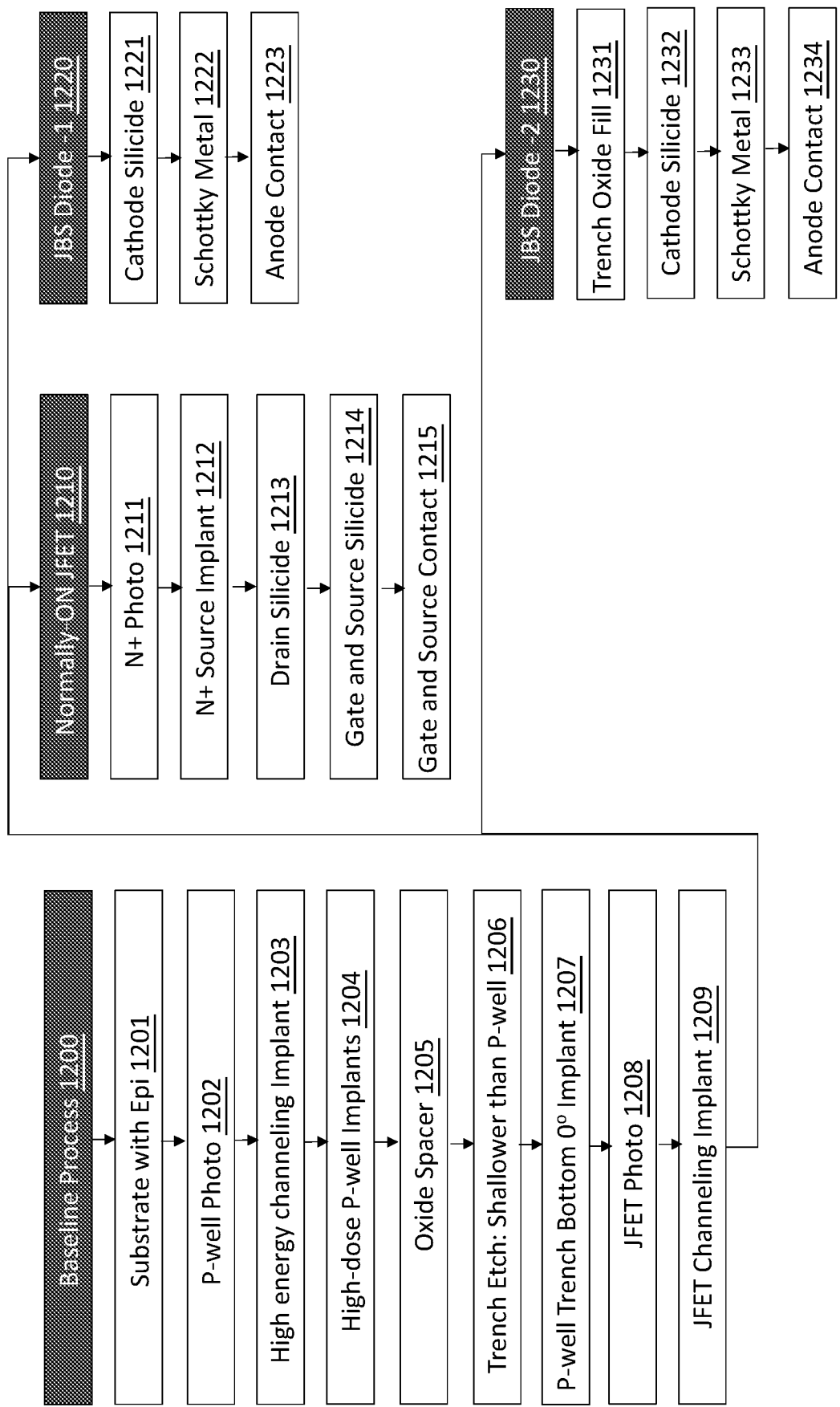
FIG. 12 illustrates a flow chart for a set of methods for forming devices in accordance with specific embodiments of the inventions disclosed herein.
Figure 15:
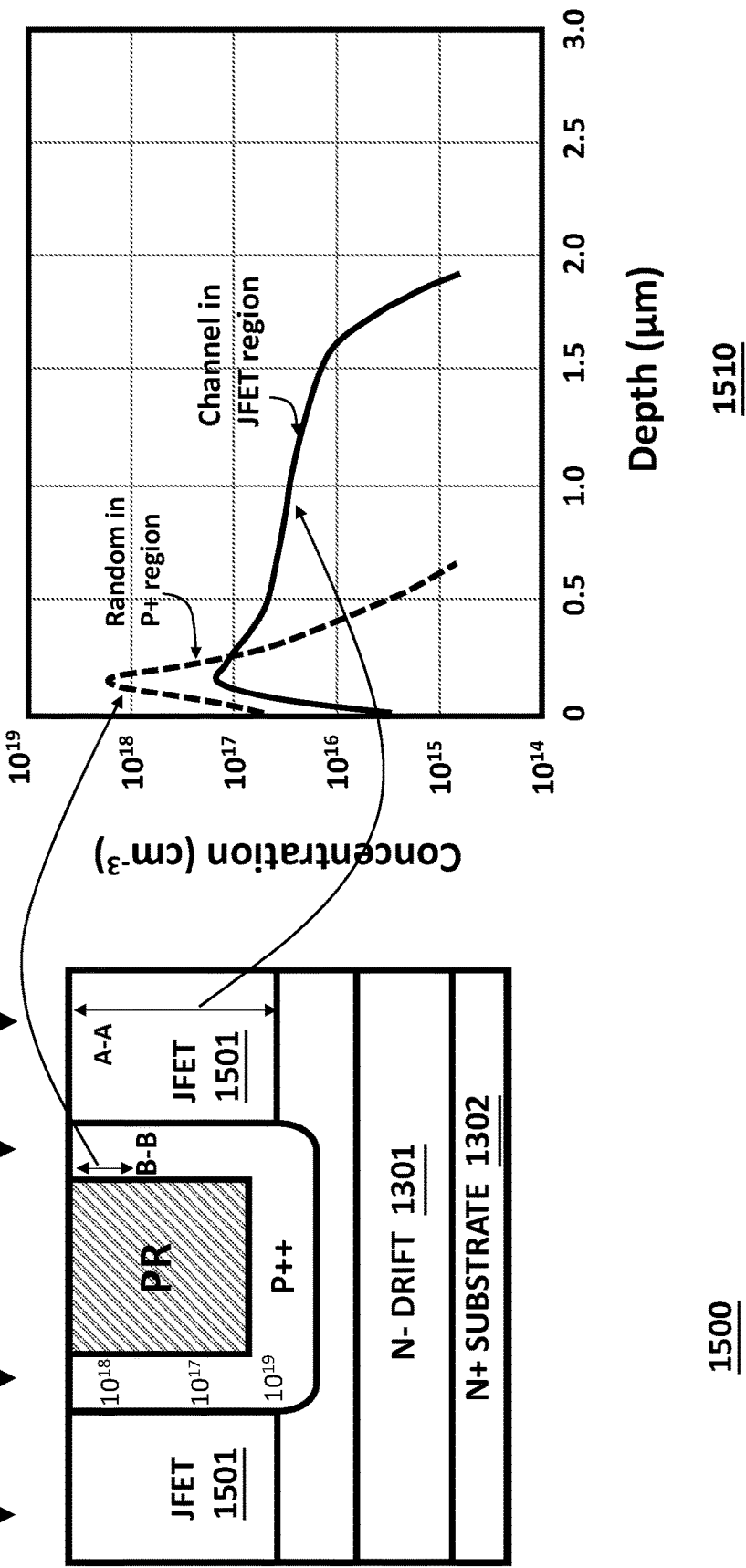
FIG. 15 illustrates a cross section of a processing step in the flow chart of FIG. 12 and an accompanying chart of dopant concentrations for a portion of that cross section in accordance with specific embodiments of the inventions disclosed herein.

FIG. 12 provides a flow chart for a set of methods for forming semiconductor devices using channeling implants in accordance with various embodiments of the invention disclosed herein. The flow chart is broken into four parts with the baseline process 1200 being shared by all the remaining portions, and the remaining portions being used to form different types of devices. An example of the baseline process can be described below with reference to FIGS. 13-15. An example of the normally-on JFET process can be described with reference to FIG. 16. Examples of two JBS diode processes can be described with reference to FIG. 17.

Figure 13:
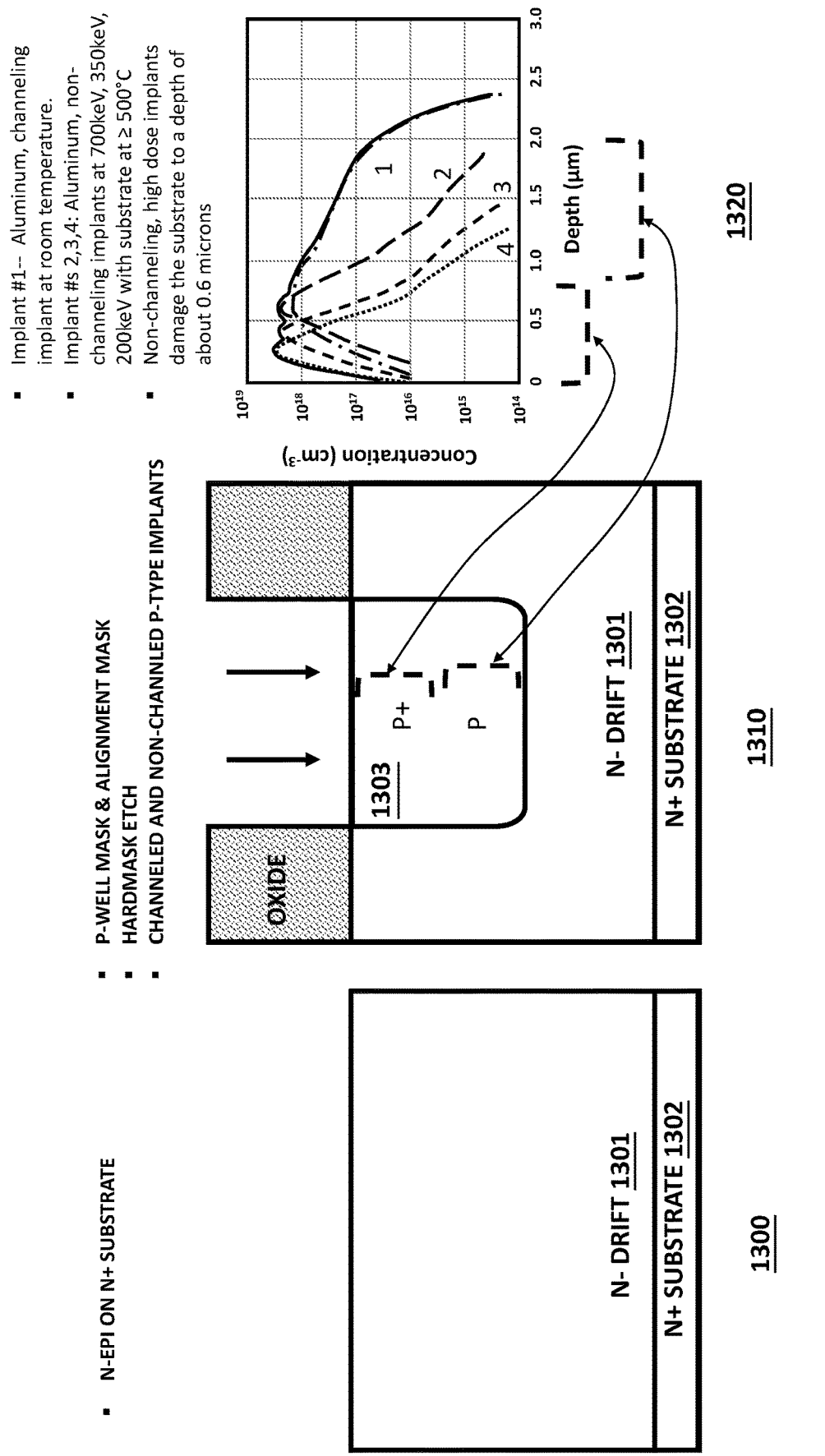
FIG. 13 illustrates cross sections of processing steps in the flow chart of FIG. 12 and an accompanying chart of dopant concentrations for a portion of those cross sections in accordance with specific embodiments of the inventions disclosed herein.

The baseline process 1200 begins with the formation of an N-Epi layer on a substrate in step 1201 as shown in cross section 1300 in FIG. 13 in which an n-drift region 1301 has been formed over an N+ substrate 1302. The process continues with step 1202 of implanting the p-well region of the device. This step can be done using a photomask as shown in cross section 1310 in which a layer of photo-patterned oxide is used as a mask for the formation of p region 1303. FIG. 12 includes two separate steps that use channeling implants. They include a first channeling implant in a step 1203 which is ultimately used to form the wells of the devices, and a second JFET channeling implant in a step 1209 which is used to form the JFET regions of the devices. The first channeling implant can form a region such as P region 1303 shown in cross section 1310 in FIG. 13 into which a trench will be formed. The second channeling implant can form a JFET region that is not shown in the figures described above but is illustrated in cross section 1500 in FIG. 15. In both cases, the channeling implant can be used to produce a deep implant into the surface of the substrate. Such a JFET region could be added to the devices illustrated above using the processes described in FIG. 12. This approach is beneficial in that the well region of the device in these processes is produced before the trench is formed such that the implant needs to penetrate much further than in other approaches for forming vertical trench device in which doping is conducted after the trench is formed.

A process for forming a semiconductor device in accordance with this disclosure can include two separate channeled implant steps to form a well region of the device and a JFET region of the device. In specific embodiments, the process can include implanting a first region of semiconductor material using a first channeled implant with a first conductivity type. For example, in cross section 1310 a first region is implanted with a first channeled implant that forms a p region 1303. In this example, the channeled implant causes a first dopant concentration profile illustrated by the dotted line which extends to the farthest depth in plot 1320. Plot 1320 shows the characteristics of the implant with the depth in micrometers as the x-axis and the concentration of the dopants in $cm^{-3}$ in a log scale on the y-axis. The first implant is an aluminum channeling implant at room temperature and causes an implant marked 1 on the plot. The first implant can be conducted as an example of a step 1203 of the baseline process. The second, third, and fourth implants are aluminum non-channeling implants with the substrate heated above 500° C. and energies of 700 kilo electron volts (keV), 350 keV, and 200 keV respectively. The implants are marked by numbers 2, 3, and 4 respectively. These implants can be conducted as an example of a step 1204 of high-dose p-well implants. The cumulative concentration is the sum of the combined implants. The non-channeling high dose implants damage the substrate to a depth of about 0.6 micrometers.

The process can also include forming, after the first channeled implant, a trench in the first region of semiconductor material as in step 1206 of baseline process 1200. For example, in cross section 1400 in FIG. 14 an etch forms a trench 1401 into the first region. This step can be preceded by a step 1205 of forming an insulator (e.g., an oxide) spacer on the mask that was used for the prior implants as in step 1205 of baseline process 1200. Such a spacer 1402 is illustrated in cross section 1400. As illustrated, the etch is shallower than the p-well region as the bottom of trench 1401 is surrounded by p-well material.

The process can also include implanting, after forming the trench 1401, a heavy doping of p-type material into the trench. The illustrated process is an example of step 1207 of conducting a p-well trench bottom implant. The implant can be at zero degrees with respect to the main face of the substrate and the crystal structure of the lattice. The insulator (e.g., oxide) can then be stripped away leaving the structure as shown in cross section 1410. In this structure, the unchanneled implants formed a region of p-type material with an implant-damaged crystal structure along the edges of the trench which provides certain benefits in terms of its resistance to later implant steps.

The baseline process 1200 can also include implanting, after forming the trench 1401, a second region of semiconductor material using a second channeled implant with a second conductivity type. The formation of this region can be conducted through a step 1208 of forming a JFET photomask on a surface of the substrate and a step 1209 of conducting a JFET channeling implant. For example, in cross section 1500, a second implant forms the n-type JFET region 1501. Chart 1510 provides an example of the doping concentration in the sidewalls of the trench and the n-type JFET region. The implant in this situation is a phosphorous implant at 150 keV. While in this example the implant is a blanket implant, that is not a limitation of this concept as the second channeled implant could be conducted using a mask. Regardless, the channeled implants can be beneficially applied in certain circumstances, such as in the case of SiC, because the implanted dopants can penetrate more deeply into the semiconductor material to form the JFET regions.

In specific embodiments of the invention, a well region of a semiconductor device fabricated using the process described in the prior paragraph will occupy at least a portion of the first region of semiconductor material that was implanted with the first channeled implant. The well region can alternatively be a first diode region (e.g., a P region) in the case of a JBS diode, or a gate region in the case of a JFET. These regions are collectively referred to as device regions in this disclosure. For example, the P regions in cross sections 1610, 1710, and 1720 all serve as device regions for their respective devices. Through the baseline portions of the processes described herein, any reference to a well region can instead be a reference to a device region. Furthermore, in the claims below, the device regions can be referenced in place of the well regions. In specific embodiments of the invention, a JFET region of a semiconductor device fabricated using the process described in the prior paragraph will occupy at least a portion of the second region of semiconductor material that was implanted with the second channeled implant. For example, the JFET regions in cross sections 1610, 1710, and 1720 can be formed using such a second channeled implant.

FIG. 12 additionally includes two separate steps of a high energy channeling implant and a high dose p-well implant. The two steps can be used to create a doped region such as the one shown in cross section 1310 with a doping profile illustrated and explained in plot 1320. In this example, the high dose p-well implant is done in stages with 3 stages illustrated by the dotted lines labeled 2-4. The channeling implant is labeled 1 in the doping profile and produces a deep p-type region. The impact of the implant is illustrated by the dot-dash line in plot 1320. The heavier doped implants then produce a heavily doped P+ region near the surface of the wafer. The combined doping profile resulting from this combination of implants is illustrated by the solid line. In specific embodiments of the invention, the resulting device exhibits certain benefits in that the heavily doped P+ region is connected to a Schottky layer and is therefore easier to bias given the heavy doping. Furthermore, the combined process exhibits certain benefits as will be described below in that it may be used to produce a crystallographically self-aligned implant channeling for a JFET region.

Crystallographically self-aligned channeling implants are a product of the impact that non-channeled implants have on the potential for channeling. As described above in the description of channeling implants, as a crystal structure is implanted with dopants the crystal structure becomes irregular and damaged, thereby lessening the efficacy of later channeled implants. Cross section 1400 illustrates the formation of a spacer on the mask which was used for the first channeled implant and the formation of a trench in the implanted region. This can be followed, as illustrated, by an optional P+ implant into the bottom of the trench which is also shown in cross section 1400. These steps can be conducted in similar fashion to the approach described in FIGS. 9-10 above. However, once the trench has been formed, a P-well profile along the sidewall of the trench will be different owing to the combined effect of the channeled implant and high dose unchanneled implant. As illustrated in cross section 1410, the top of the sidewall has a P+ characteristic and the lower portion of the sidewall has a P characteristic. This has the benefit of providing a solid contact to the P region of the device as described above. However, this is not the only benefit as the P+ region is also effectively shielded from the impact of additional channeling implants as the crystal structure has been damaged. Therefore, subsequently, and as shown in cross section 1500, a channeled n-type implant can be used to form a JFET region for the device without any need to mask the P+ region. Additionally, the implant energy of the channeled implant for the JFET region can be higher without having an appreciable impact on the P+ region. This is therefore a crystallographically self-aligned channeling implant.

A specific example of a JFET channeling implant which has been crystallographically self-aligned can be described with reference to cross sections 1500 and chart 1510 where chart 1510 illustrates a dopant concentration profile for the two marked portions of cross section 1500. In the example, the substrate is aligned properly to enable JFET implant channeling in region A-A. In region B-B, implant channeling does not occur since the crystal is damaged from the P-well implants. Even though the width of the P+ doped region is uniform from the top to bottom of the trench, P-type dopant concentration is not uniform from top to bottom. It is about $2 \times 10^{18}$ cm$^{-3}$ to a depth of 0.5 microns from the top, about $2 \times 10^{17}$ cm$^{-3}$ from 0.6 microns to 1.4 microns and $10^{19}$ cm$^{-3}$ at the very bottom of the trench. It is important to preserve the P-region concentration (and not counter-dope with n-type) so that the n-type JFET region can be pinched off when the device is in the off-mode. Ion channeling is decreased along the trench sidewall while channeling n-type implants in the JFET region due to the significantly damaged surface generated by the high dosage p-implants. For example, the proposed approach device structure decreases the channeling of a phosphorus implant in the p-region.

A process for forming a semiconductor device in accordance with this disclosure can include a first non-channeled implant and a second channeled implant. The implants can include multiple implants. The first non-channeled implant can commence with a channeled implant and be followed by non-channeled implants (i.e., the combined implants such as those plotted in plot 1320 cumulatively constitute a non-channeled implant even though they commence with a channeled implant). The first non-channeled implant(s) can be used to form a well region of the device. The second channeled implant can be used to form a JFET region of the device. The process can include implanting a first region of semiconductor material using a first non-channeled implant with a first conductivity type. For example, the process could include implanting a portion of the n-drift region in cross section 1300 with an implant as shown in cross section 1310. The process can also include forming, after the first non-channeled implant, a trench in the first region of semiconductor material. For example, the process could include forming a trench 1401 in the first region of semiconductor material of cross section 1310 as shown in cross section 1400. The process can also include implanting, after forming the trench, a second region of semiconductor material using a second channeled implant with a second conductivity type. For example, the process could include implanting the second implant shown in cross section 1410 into a region of the device as shown in cross section 1400. The well region of the semiconductor device can occupy at least a portion of the first region of semiconductor material that was implanted with the first non-channeled implant. A JFET region of the semiconductor device can occupy at least a portion of the second region of semiconductor material that was implanted with the second channeled implant. The portion of the first region of semiconductor material that was implanted with the first non-channeled implant can have a higher dopant concentration than the portion of the second region of semiconductor material that was implanted with the second channeled implant. Such a process can be combined with the processes described above in which the non-channeled implant is preceded by a first channeled implant. Accordingly, the process described in this paragraph could include implanting, before the first non-channeled implant, the first region of semiconductor material using a first channeled implant with the first conductivity type. For example, a device could utilize both the implants described with reference to cross sections 1310 and plot 1320 and the implant described with reference to cross section 1500 and chart 1510. The process described in this paragraph can result in a JFET region formed by a crystallographically self-aligned channeling implant.

After being produced in the manner described above, the JFET and P regions can serve in various device types as mentioned above depending upon which finishing steps from FIG. 12 the device takes. The device could be a normally-on JFET if the steps in process 1210 are carried out. These steps include an N+ photomask step 1211, an N+ source implant step 1212, a drain silicide formation step 1213, a gate and source silicide formation step 1214, a gate and source contact step 1215. The steps are illustrated in cross sections 1600 and 1610 in FIG. 16. The N+ photomask step 1211 and N+ source implant step 1212 result in the formation of the N+ source regions of the device 1603. The N+ source implant step 1212 can be conducted with a photoresist 1602 formed in the trench as shown in cross section 1600. The drain silicide formation step 1213 and the gate and source silicide formation step 1214 result in the formation of silicide regions that can provide good contact to the gate, source, and drain metal. The gate and source contact step 1215 results in the formation of source contact 1612 and gate contact 1611. Drain contact 1613 can be formed using similar approaches to those described above with reference to the cathode contact 390 of FIG. 11.

Figure 17:
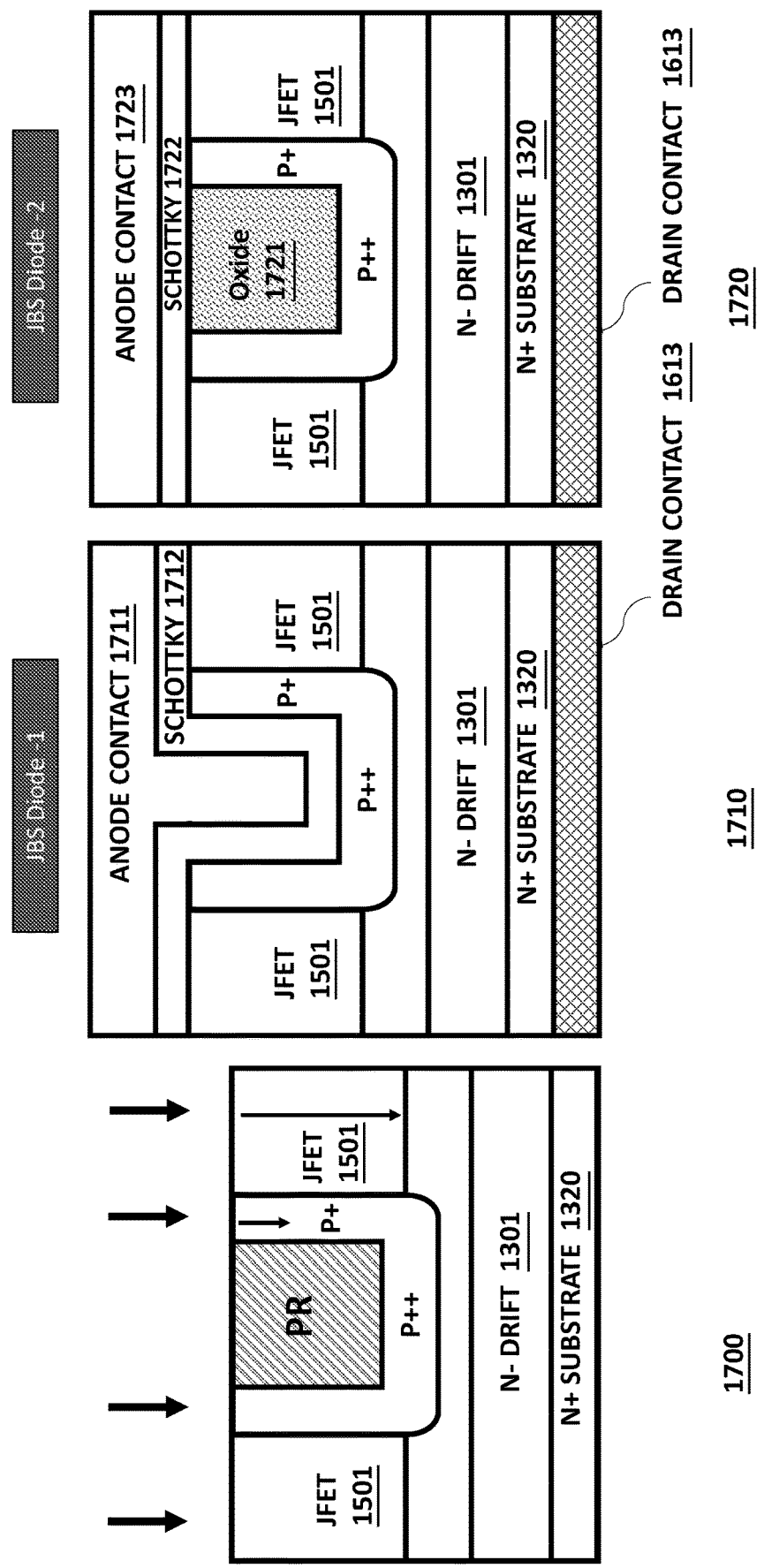
FIG. 17 illustrates a cross section of a processing step in the flow chart of FIG. 12, and two cross sections of a first and a second junction barrier Schottky field effect transistor formed using processing steps in the flow chart of FIG. 12 in accordance with specific embodiments of the inventions disclosed herein.

The device could alternatively be a JBS diode with Schottky metal formed in the trench as shown in cross section 1710 of FIG. 17 (e.g., JBS Diode-1 1220) or a JBS diode with insulator in the trench as shown in cross section 1720 of FIG. 17 (e.g., JBS Diode-1 1230). For example, the JBS diode-1 1220 may be formed by a cathode silicide step 1221, a Schottky metal step 1222, and an anode contact step 1223 and the JBS diode-2 1230 may be formed by a trench oxide fill step 1231, a cathode silicide step 1232, a Schottky metal step 1233, and an anode contact step 1234. Both of these devices can be formed by a self-aligned JFET channeling implant as shown in cross section 1700. In either of these cases, the photoresist, or alternative mask material, which filled the trench during the JFET implant, would be removed as part of this process. In the example of cross section 1710, a Schottky layer 1712 and anode contact 1711 extend into the trench. In the example of cross section 1720, an oxide 1721 is formed in the trench and a Schottky layer 1722 and anode contact 1723 are formed above the oxide.

In the approaches illustrated above and discussed with reference to FIG. 12, the first implanted region is deeper than the trench. In specific applications, this is not a desirable configuration given the potential penetration depth of the implant and the desired device characteristics determined by the depth of the trench such as the length (measured from the top of the substrate towards the bottom) of the depletion region formed when the diode or normally-on device is biased in the off state. For example, in an SiC wafer, the implant profile for P-well channeling is around 1 micron deep for implant energies that are less than 200 keV. As such, a desired trench depth of greater than 1 micron will result in the first implanted region not being as deep as the trench. While the implant energy of the first channeling implant could be increased beyond 200 keV, this can produce deleterious results in that the efficacy of the channeling implant becomes highly sensitive to the implant angle at higher energies. As a result, the implant may have too much variation from substrate to substrate with higher implant energies, resulting in a less reliable manufacturing process. Approaches for addressing the trench being deeper than the first implanted region are described below with reference to FIGS. 18-20.

Figure 18:
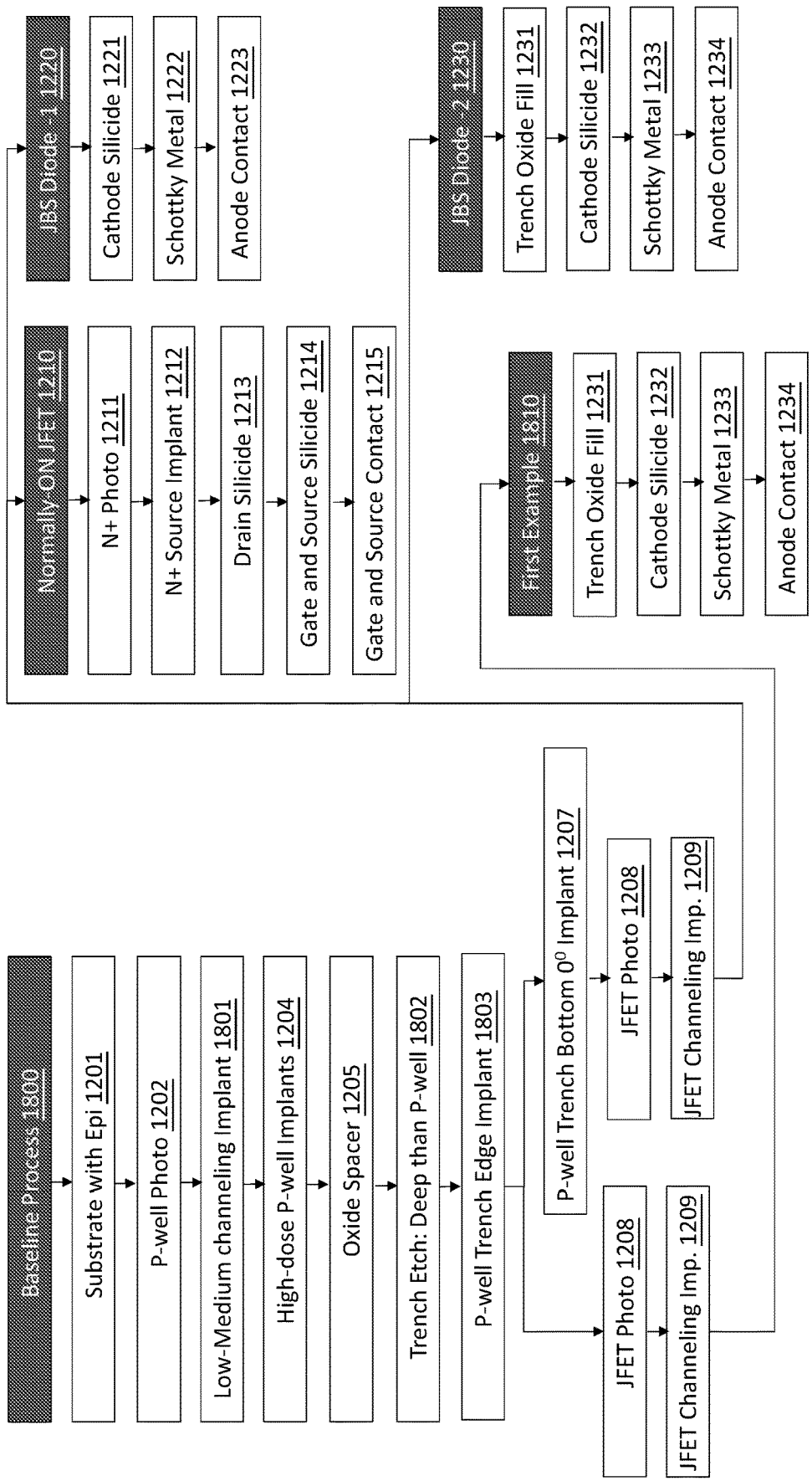
FIG. 18 illustrates a flow chart for a set of methods for forming devices using a low to medium channeling implant in accordance with specific embodiments of the inventions disclosed herein.
Figure 19:
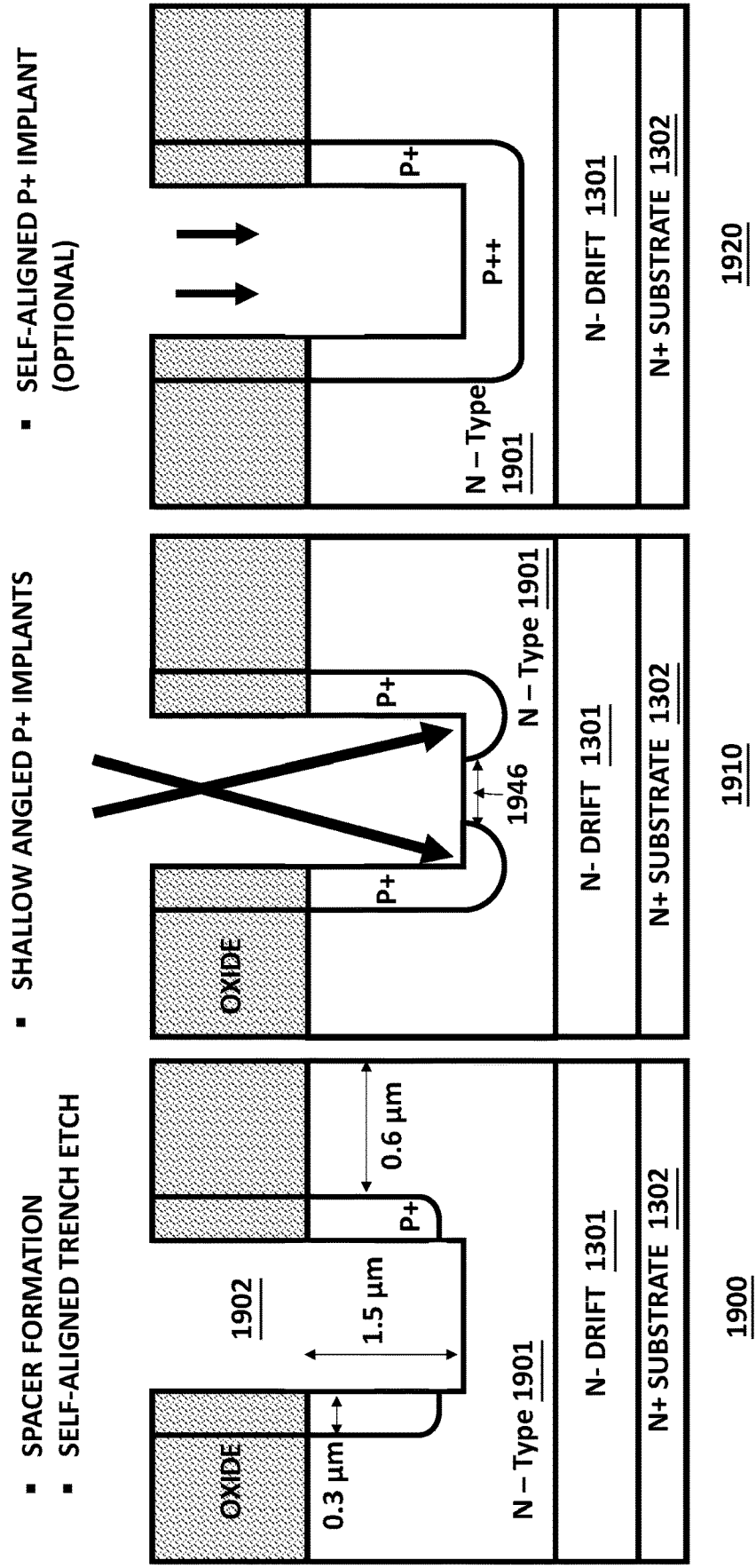
FIG. 19 illustrates cross sections of processing steps in the flow chart of FIG. 18 in accordance with specific embodiments of the inventions disclosed herein.

FIG. 18 includes a flow chart for a set of methods for forming semiconductor devices in accordance with various embodiments of the invention disclosed herein. The flow chart is broken into five parts with the baseline process 1800 being shared by all the remaining portions, and the remaining portions being used to form different types of devices. Steps that are similar to those described with reference to FIG. 12 are labeled with the same reference numbers. Those of ordinary skill in the art will recognize that the steps will be performed slightly differently if they are preceded by a processing step that is unique to FIG. 18. An example of the baseline process can be described with reference to FIG. 19. Notably, the channeling implant in the baseline process in cross section 1801 is a low to medium energy channeling implant as compared to the high energy implant of cross section 1310. The combined low to medium energy channeling implant and high energy non-channeling implant will then produce an implanted region that is similar to the one produced in cross section 1310, but with a shallower extent. Furthermore, while the trench formed in the process of cross section 1900 can be formed with at least one spacer, similar to the approach in cross section 1400, the trench 1902 formed in the implanted region will, as shown in cross section 1900, extend below the bottom of the implanted region and into n-type region 1901. Cross section 1900 shows an example of the execution of trench etch step 1802 in which the resulting trench is deeper than the p-well region.

In specific embodiments of the invention, the bottom of the trench can be subjected to an additional implant after the trench is formed. The bottom of the trench can be subject to an angled implant. For example, as shown in cross section 1910, the bottom of the trench can be subjected to an angled implant to dope the bottom edges of the trench. Using this approach, the bottom of the trench can still include a gap 1946 which is not doped to increase the radiation hardening of the device. However, the sidewalls of the trench will still be doped and serve as a well region for the finished device all the way from the top to the bottom of the trench. This overall approach has an advantage when compared to alternative approaches in which the trench is formed first and the sidewalls are then doped in that the angled implants are best suited for doping the bottom corners of the trench as the required angle is not very large and the dopants are able to reach that portion of the trench. In the alternative or in combination, the bottom of the trench can be subjected to a zero-degree tilt implant. For example, as shown in cross section 1910, the bottom of the trench can receive a heavy p-type doping which is beneficial for certain finished devices. Cross section 1910 shows an example of the execution of p-well trench edge implant step 1803 in which the resulting trench is deeper than the p-well region.

In cross section 1920, the baseline process continues with a JFET channeling implant which can be a crystallographically self-aligned implant. The implant can be similar to that described with reference to cross section 1500 and chart 1510. In embodiments in which the first implanted region is implanted with an implant that damages the crystal structure such that channeling can no longer occur in that region, the subsequent JFET channeling implant will not have an appreciable impact.

The baseline process 1800 can be extended to produce various devices. The final steps can be similar to those conducted to produce the JBS diode of cross section 1710, the JBS diode of cross section 1720, the normally-on JFET of cross section 1610, and various other devices. In particular, if the branch of the baseline process which does not include a bottom zero-degree implant is used, the JBS diode of cross section 1720 can be produced in which there is a gap between the two p-type regions formed on the sidewalls of the trench. Indeed, portions of the baseline process of FIG. 18 can be described with reference to FIGS. 6-8. Although the approach in FIGS. 6-8 does not include a JFET implant or any channeling implants, the remaining steps of the process in FIG. 18 that move through the path without the zero-degree implant and that terminate in the JBS diode design −3 flow are represented in those figures. This is represented by flow chart 1810 which extends from baseline process 1800 such that step 1207 is skipped.

FIG. 20 describes how the approach of crystallographically self-aligned channeling implants disclosed herein can be applied to a planar device. As illustrated, because the top portion of the implanted P region has been damaged, a subsequent channeled N implant will not have an appreciable impact on the P region and the two regions can be formed in a self-aligned manner without the need for masks. The regions formed in this example are P-well and N-well regions, formed in cross sections 2000 and 2020 respectively, but a similar approach can be used to form self-aligned implanted regions for various purposes. Both cross sections 2000 and 2020 can also express the benefit of deep penetration from channeled implants if the first implanted region is formed by a first channeled implant and followed by a stronger implant that disrupts the crystal structure or a single first channeled implant that disrupts the crystal structure of the semiconductor material. Cross section 2000 includes the formation of a p-well mask and an etch of the hard mask, followed by channeled and non-channeled p-well implants with similar characteristics to those described with reference to plot 1320 and as illustrated in chart 2010. Cross section 2020 includes an n-well mask, a hardmask oxide strip, and channeled n-well implants. Since the top part of the p-well implanted substrate is damaged, the n-well implant channels only in the area of interest marked A-A and stops at a shallow depth in the p-well region marked B-B, resulting in crystallographic self-alignment. A similar outcome is expected when the implant types are reversed.

Specific embodiments of the inventions disclosed herein can result in a vertical diode having various characteristics. The vertical diode can have an N+ substrate with an n-epitaxial layer and a p-type implant region with a width of 1-3 microns. The p-type implant region can be formed in the n-epitaxial layer by multiple low and high energy implants to a depth of 1-2.5 microns. The vertical diode can also have a self-aligned trench formed in the p-type region. The self-aligned trench can be formed using at least one spacer as described above. The trench can have a width of 1-2 microns as defined by the spacer. The trench can have a trench depth of 1-2.5 microns and be deeper than the p-type implant region by 0.5-1.5 microns. The p-type implant region remaining after the formation of the trench can be defined by the one or more spacers and have a width of 0.3-0.7 microns after the trench etch. The vertical diode can also have mesa regions each having a width of 1-4 microns, wherein each mesa region is provided between two adjacent trenches. The mesa region can include the P+ implanted region. The trench bottom corners can be converted from n-epi to P+ by an angled implant. The trench bottom center region is not implanted. The trench region can be filled with dielectric. The vertical diode can also have a metal layer functioning as a cathode electrode on the rear side of the N+ substrate of the Schottky diode. The vertical diode can also have a metal layer functioning as an anode electrode on the front side of the substrate. The vertical diode can also have an anode metal layer forming electrical contact to the P+ implanted region on the top side of the P+ implanted region. The surface area of the P+ implanted region to the n-epitaxial layer area can be less than 40% on the whole die.

Specific embodiments of the invention disclosed herein can result in a vertical diode having various characteristics. The vertical diode can have an N+ substrate with an n-epitaxial layer and a p-type implant region with a width of 1-3 microns. The p-type implant region can be formed in the n-epitaxial layer by multiple low and high energy implants to a depth of 1-3 microns and a width of 2-3 microns. The vertical diode can also have a self-aligned trench formed in the p-type region. The self-aligned trench can be formed using at least one spacer as described above. The trench can have a width of 1-2 microns as defined by the spacer. The trench can have a trench depth of 0.5-1 microns and be shallower than the p-type implant region by 0.3-0.7 microns. The p-type implant region remaining after the formation of the trench can be defined by the one or more spacers and have a width of 0.3-0.7 microns after the trench etch. The vertical diode can also have mesa regions each having a width of 1-4 microns, wherein each mesa region is provided between two adjacent trenches. The mesa region can include the P+ implanted region. The trench bottom corners can be converted from n-epi to P+ by an angled implant. The trench bottom center region is not implanted. The trench region can be filled with dielectric. The vertical diode can also have a metal layer functioning as a cathode electrode on the rear side of the n+ substrate of the Schottky diode. The vertical diode can also have a metal layer functioning as an anode electrode on the front side of the substrate. The vertical diode can also have an anode metal layer forming electrical contact to the P+ implanted region on the top side of the P+ implanted region.

Specific embodiments of the invention disclosed herein can result in trench devices such as JBS diodes, JFET devices, and MOSFET devices having various characteristics. The devices can include one or more regions formed by masked n-type implant to tailor the dopant profiles. The devices could include a deep box-like profile of p-type dopant using a combination of channeling ion implants and non-channeling ion implants. The channel implants could be completed before the non-channeling implants. The device could include a self-aligned trench formed within the box-like profile region. The device could include mesa structures with sidewalls formed by the box-like profile region after the trench was formed. The device could optionally include an area formed by an additional p-implant at the bottom of the trench.

While the specification has been described in detail with respect to specific embodiments of the invention, it will be appreciated that those skilled in the art, upon attaining an understanding of the foregoing, may readily conceive of alterations to, variations of, and equivalents to these embodiments. For example, although the example of a vertical device was used throughout this disclosure, specific embodiments disclosed herein are more broadly applicable to lateral devices. As another example, while the disclosure focused on a single cell of a device, the approaches disclosed herein are applicable to devices with any number of such cells arrayed in multiple rows and columns. As another example, while devices having a first implant region with a first conductivity type being p-type were used as an example throughout this disclosure, the conductivity types of the various regions disclosed herein could be switched to form devices of opposite conductivity types. Furthermore, although SiC and Si semiconductor materials were provided by way of example, specific embodiments disclosed herein are broadly applicable to any form of semiconductor technology including any III-V semiconductor material and other compound semiconductor material. These and other modifications and variations to the present invention may be practiced by those skilled in the art, without departing from the scope of the present invention, which is more particularly set forth in the appended claims.

What is claimed is:

1. A process for forming a semiconductor device, with a well region, comprising:
   implanting a first region of semiconductor material using a first implant and a first mask;
   forming, after the first implant, at least one spacer on the first mask; and
   forming a trench in the first region of semiconductor material using the at least one spacer and the first mask;
   wherein the well region of the semiconductor device occupies at least a portion of the first region of semiconductor material that was implanted with the first implant.

2. The process from claim 1, further comprising:
   implanting, after forming the trench, a second region of semiconductor material using a second channeled implant with a second conductivity type;
   wherein the first implant is a non-channeled implant.

3. The process from claim 2, wherein:
   the semiconductor device includes a junction field effect region; and
   the junction field effect region of the semiconductor device occupies at least a portion of the second region of semiconductor material that was implanted with the second channeled implant.

4. The process from claim 3, whereby:
   the junction field effect region is formed by a crystallographically self-aligned channeling implant.

5. The process from claim 3, further comprising:
   forming a cathode contact below the well region of the semiconductor device;
   forming a Schottky layer above the well region of the semiconductor device; and
   forming an anode contact above the Schottky layer of the semiconductor device;
   wherein the semiconductor device is a trench junction barrier semiconductor diode.

6. The process from claim 3, further comprising:
   forming a drain contact below the well region of the semiconductor device; and
   forming a gate contact of the semiconductor device;
   wherein the semiconductor device is a normally-on junction field effect transistor.

7. The process from claim 1, wherein:
   the trench extends below the first region of semiconductor material that was implanted with the first implant; and
   the process further comprises: implanting, after forming the trench, a bottom of the trench using a shallow angled implant.

8. A process for forming a semiconductor device comprising:
   implanting a first region of semiconductor material using a first channeled implant with a first conductivity type;
   implanting, after the first channeled implant, a second region of semiconductor material using a second channeled implant with a second conductivity type;
   wherein the first channeled implant disrupts a crystal structure of the first region of semiconductor material and does not disrupt a crystal structure of the second region of semiconductor material.

9. The process of claim 8, whereby:
   the second channeled implant is a crystallographically self-aligned channeling implant.

10. The process of claim 8, further comprising:
    implanting the first region of semiconductor material using a first non-channeled implant with the first conductivity type prior to the first channeled implant.

11. The process of claim 10, wherein:
    the first channeled implant is a low or medium dose implant; and
    the first non-channeled implant is a high dose implant.

12. The process of claim 8, wherein:
    the semiconductor device includes a first well region and the first well region occupies at least a portion of the first region of semiconductor material that was implanted with the first channeled implant; and
    the semiconductor device includes a second well region of the second conductivity type and the second well region occupies at least a portion of the second region of semiconductor material that was implanted with the second channeled implant.

13. The process of claim 8, wherein:
    the first channeled implant is a masked implant; and
    the second channeled implant is a blanket implant.

14. The process of claim 8, wherein:
    a well region of the semiconductor device occupies at least a portion of the first region of semiconductor material that was implanted with the first channeled implant, and a junction field effect region of the semiconductor device occupies at least a portion of the second region of semiconductor material that was implanted with the second channeled implant.

15. The process of claim 8, further comprising:
    forming, after the first channeled implant, a trench in the first region of semiconductor material;
    wherein the second channeled implant is conducted after forming the trench.

16. A process for forming a semiconductor device, with a well region and a junction field effect region, comprising:
    implanting a first region of semiconductor material using a first non-channeled implant with a first conductivity type;
    forming, after the first non-channeled implant, a trench in the first region of semiconductor material; and
    implanting, after forming the trench, a second region of semiconductor material using a second channeled implant with a second conductivity type;
    wherein the well region of the semiconductor device occupies at least a portion of the first region of semiconductor material that was implanted with the first non-channeled implant, the junction field effect region of the semiconductor device occupies at least a portion of the second region of semiconductor material that was implanted with the second channeled implant, and the portion of the first region of semiconductor material has a higher dopant concentration than the portion of the second region of semiconductor material.

17. The process from claim 16, further comprising:
implanting, before the first non-channeled implant, the first region of semiconductor material using a first channeled implant with the first conductivity type.

18. The process from claim 16, whereby:
the junction field effect region is formed by a crystallographically self-aligned channeling implant.

19. The process from claim 16, wherein:
the first non-channeled implant is preceded by a first channeled implant into the first region of semiconductor material;
the trench extends below a portion of the first region of semiconductor material that was implanted with the first channeled implant; and
the process further comprises: implanting, after forming the trench, a bottom of the trench using a shallow angled implant.

20. The process from claim 16, wherein:
the first non-channeled implant is preceded by a first channeled implant into the first region of semiconductor material;
the trench does not extend below a portion of the first region of semiconductor material that was implanted with the first channeled implant; and
the process further comprises: implanting, after forming the trench, a bottom of the trench using a zero degree implant.

* * * * *